(12) United States Patent
Maharita

(10) Patent No.: US 8,089,288 B1
(45) Date of Patent: Jan. 3, 2012

(54) CHARGE ACCUMULATION CAPACITANCE SENSOR WITH LINEAR TRANSFER CHARACTERISTIC

(75) Inventor: Andrey Maharita, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/601,465

(22) Filed: Nov. 16, 2006

(51) Int. Cl.
 *G01R 27/26* (2006.01)
(52) U.S. Cl. .................................... 324/678; 324/658
(58) Field of Classification Search ................ 324/678, 324/676, 658, 649, 600, 686, 665, 672, 679, 324/519, 548, 76.66, 76.11
See application file for complete search history.

(56) References Cited

U.S. PATENT DOCUMENTS

| | | |
|---|---|---|
| 4,264,903 A | 4/1981 | Bigelow |
| 4,283,713 A | 8/1981 | Philipp |
| 4,293,734 A | 10/1981 | Pepper, Jr. |
| 4,438,404 A | 3/1984 | Philipp |
| 4,475,151 A | 10/1984 | Philipp |
| 4,497,575 A | 2/1985 | Philipp |
| 4,736,097 A | 4/1988 | Philipp |
| 4,736,191 A | 4/1988 | Matzke et al. |
| 4,742,331 A | 5/1988 | Barrow et al. |
| 4,772,983 A | 9/1988 | Kerber et al. |
| 4,773,024 A | 9/1988 | Faggin et al. |
| 4,802,103 A | 1/1989 | Faggin et al. |
| 4,831,325 A | 5/1989 | Watson, Jr. |
| 4,876,534 A | 10/1989 | Mead et al. |
| 4,879,461 A | 11/1989 | Philipp |
| 4,879,505 A | 11/1989 | Barrow et al. |
| 4,920,399 A | 4/1990 | Hall |
| 4,935,702 A | 6/1990 | Mead et al. |
| 4,940,980 A | 7/1990 | Tice |
| 4,953,928 A | 9/1990 | Anderson et al. |
| 4,962,342 A | 10/1990 | Mead et al. |
| 4,977,480 A * | 12/1990 | Nishihara ................ 361/283.4 |
| 5,049,758 A | 9/1991 | Mead et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,095,284 A | 3/1992 | Mead |
| 5,097,305 A | 3/1992 | Mead et al. |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,146,106 A | 9/1992 | Anderson et al. |
| 5,160,899 A | 11/1992 | Anderson et al. |
| 5,165,054 A | 11/1992 | Platt et al. |
| 5,166,562 A | 11/1992 | Allen et al. |
| 5,204,549 A | 4/1993 | Platt et al. |

(Continued)

OTHER PUBLICATIONS

Dennis Seguine, "Capacitive Key Scan", Application Note, AN2233, Revision A, Cypress Microsystems, http://www.cypress.com/, http://www.cypress.com/support/mysupport.cfm, Oct. 15, 2004, pp. 1-7.

(Continued)

*Primary Examiner* — Vincent Q Nguyen
*Assistant Examiner* — Hoai-An D Nguyen

(57) ABSTRACT

A method and apparatus for capacitance sensing uses an offset feedback voltage to linearize a charge-transfer characteristic.

11 Claims, 14 Drawing Sheets

U.S. PATENT DOCUMENTS

| | | | |
|---|---|---|---|
| 5,243,554 A | 9/1993 | Allen et al. | |
| 5,248,873 A | 9/1993 | Allen et al. | |
| 5,260,592 A | 11/1993 | Mead et al. | |
| 5,270,963 A | 12/1993 | Allen et al. | |
| 5,276,407 A | 1/1994 | Mead et al. | |
| 5,281,862 A | 1/1994 | Ma | |
| 5,289,023 A | 2/1994 | Mead | |
| 5,294,889 A | 3/1994 | Heep et al. | |
| 5,303,329 A | 4/1994 | Mead et al. | |
| 5,305,017 A | 4/1994 | Gerpheide | |
| 5,323,158 A | 6/1994 | Ferguson, Jr. | |
| 5,324,958 A | 6/1994 | Mead et al. | |
| 5,331,215 A | 7/1994 | Allen et al. | |
| 5,336,936 A | 8/1994 | Allen et al. | |
| 5,339,213 A | 8/1994 | O'Callaghan | |
| 5,349,303 A | 9/1994 | Gerpheide | |
| 5,374,787 A | 12/1994 | Miller et al. | |
| 5,381,515 A | 1/1995 | Platt et al. | |
| 5,384,467 A | 1/1995 | Plimon et al. | |
| 5,408,194 A | 4/1995 | Steinbach et al. | |
| 5,412,387 A | 5/1995 | Vincelette et al. | |
| 5,488,204 A | 1/1996 | Mead et al. | |
| 5,495,077 A | 2/1996 | Miller et al. | |
| 5,541,878 A | 7/1996 | LeMoncheck et al. | |
| 5,543,588 A | 8/1996 | Bisset et al. | |
| 5,543,590 A | 8/1996 | Gillespie et al. | |
| 5,543,591 A | 8/1996 | Gillespie et al. | |
| 5,555,907 A | 9/1996 | Philipp | |
| 5,565,658 A | 10/1996 | Gerpheide et al. | |
| 5,566,702 A | 10/1996 | Philipp | |
| 5,572,205 A | 11/1996 | Caldwell et al. | |
| 5,589,856 A | 12/1996 | Stein et al. | |
| 5,629,891 A | 5/1997 | LeMoncheck et al. | |
| 5,648,642 A | 7/1997 | Miller et al. | |
| 5,670,915 A | 9/1997 | Cooper et al. | |
| 5,672,959 A | 9/1997 | Der | |
| 5,682,032 A | 10/1997 | Philipp | |
| 5,684,487 A | 11/1997 | Timko | |
| 5,694,063 A | 12/1997 | Burlison et al. | |
| 5,730,165 A | 3/1998 | Philipp | |
| 5,748,185 A | 5/1998 | Stephan et al. | |
| 5,757,368 A | 5/1998 | Gerpheide et al. | |
| 5,763,909 A | 6/1998 | Mead et al. | |
| 5,763,924 A | 6/1998 | Lum et al. | |
| 5,767,457 A | 6/1998 | Gerpheide et al. | |
| 5,796,183 A | 8/1998 | Hourmand | |
| 5,812,698 A | 9/1998 | Platt et al. | |
| 5,841,078 A | 11/1998 | Miller et al. | |
| 5,844,265 A | 12/1998 | Mead et al. | |
| 5,854,625 A | 12/1998 | Frisch et al. | |
| 5,861,583 A | 1/1999 | Schediwy et al. | |
| 5,861,875 A | 1/1999 | Gerpheide | |
| 5,864,242 A | 1/1999 | Allen et al. | |
| 5,864,392 A | 1/1999 | Winklhofer et al. | |
| 5,880,411 A | 3/1999 | Gillespie et al. | |
| 5,889,236 A | 3/1999 | Gillespie et al. | |
| 5,905,489 A | 5/1999 | Takahama et al. | |
| 5,914,465 A | 6/1999 | Allen et al. | |
| 5,914,708 A | 6/1999 | LaGrange et al. | |
| 5,920,310 A | 7/1999 | Faggin et al. | |
| 5,926,566 A | 7/1999 | Wang et al. | |
| 5,942,733 A | 8/1999 | Allen et al. | |
| 5,943,052 A | 8/1999 | Allen et al. | |
| 5,969,513 A | 10/1999 | Clark | |
| 6,023,422 A | 2/2000 | Allen et al. | |
| 6,028,271 A | 2/2000 | Gillespie et al. | |
| 6,028,959 A | 2/2000 | Wang et al. | |
| 6,097,432 A | 8/2000 | Mead et al. | |
| 6,148,104 A | 11/2000 | Wang et al. | |
| 6,185,450 B1 | 2/2001 | Seguine et al. | |
| 6,188,228 B1 | 2/2001 | Philipp | |
| 6,188,391 B1 | 2/2001 | Seely et al. | |
| 6,222,528 B1 | 4/2001 | Gerpheide et al. | |
| 6,239,389 B1 | 5/2001 | Allen et al. | |
| 6,249,447 B1 | 6/2001 | Boylan et al. | |
| 6,262,717 B1 | 7/2001 | Donohue et al. | |
| 6,271,719 B1 | 8/2001 | Sevastopoulos | |
| 6,271,720 B1 | 8/2001 | Sevastopoulos | |
| 6,278,283 B1 * | 8/2001 | Tsugai | 324/678 |
| 6,280,391 B1 | 8/2001 | Olson et al. | |
| 6,288,707 B1 | 9/2001 | Philipp | |
| 6,304,014 B1 | 10/2001 | England et al. | |
| 6,320,184 B1 | 11/2001 | Winklhofer et al. | |
| 6,323,846 B1 | 11/2001 | Westerman et al. | |
| 6,326,859 B1 | 12/2001 | Goldman et al. | |
| 6,342,817 B1 | 1/2002 | Crofts et al. | |
| 6,344,773 B1 | 2/2002 | Sevastopoulos et al. | |
| 6,377,009 B1 | 4/2002 | Philipp | |
| 6,380,929 B1 | 4/2002 | Platt | |
| 6,380,931 B1 | 4/2002 | Gillespie et al. | |
| 6,400,217 B1 | 6/2002 | Bhandari | |
| 6,414,671 B1 | 7/2002 | Gillespie et al. | |
| 6,430,305 B1 | 8/2002 | Decker | |
| 6,441,073 B1 | 8/2002 | Tanaka et al. | |
| 6,441,682 B1 | 8/2002 | Vinn et al. | |
| 6,445,257 B1 | 9/2002 | Cox et al. | |
| 6,448,911 B1 | 9/2002 | Somayajula | |
| 6,452,514 B1 | 9/2002 | Philipp | |
| 6,457,355 B1 | 10/2002 | Philipp | |
| 6,459,321 B1 | 10/2002 | Belch | |
| 6,466,036 B1 * | 10/2002 | Philipp | 324/678 |
| 6,473,069 B1 | 10/2002 | Gerpheide | |
| 6,489,899 B1 | 12/2002 | Ely et al. | |
| 6,498,720 B2 | 12/2002 | Glad | |
| 6,499,359 B1 | 12/2002 | Washeleski et al. | |
| 6,677,932 B1 | 1/2003 | Westerman | |
| 6,522,083 B1 | 2/2003 | Roach | |
| 6,522,128 B1 | 2/2003 | Ely et al. | |
| 6,522,187 B1 | 2/2003 | Sousa | |
| 6,523,416 B2 | 2/2003 | Takagi et al. | |
| 6,534,970 B1 | 3/2003 | Ely et al. | |
| 6,535,200 B2 | 3/2003 | Philipp | |
| 6,570,557 B1 | 5/2003 | Westerman et al. | |
| 6,583,632 B2 | 6/2003 | Von Basse et al. | |
| 6,587,093 B1 | 7/2003 | Shaw et al. | |
| 6,610,936 B2 | 9/2003 | Gillespie et al. | |
| 6,614,313 B2 | 9/2003 | Crofts et al. | |
| 6,624,640 B2 | 9/2003 | Lund et al. | |
| 6,639,586 B2 | 10/2003 | Gerpheide | |
| 6,642,857 B1 | 11/2003 | Schediwy et al. | |
| 6,649,924 B1 | 11/2003 | Philipp et al. | |
| 6,667,740 B2 | 12/2003 | Ely et al. | |
| 6,673,308 B2 | 1/2004 | Hino et al. | |
| 6,680,731 B2 | 1/2004 | Gerpheide et al. | |
| 6,683,462 B2 | 1/2004 | Shimizu | |
| 6,704,005 B2 | 3/2004 | Kato et al. | |
| 6,705,511 B1 | 3/2004 | Dames et al. | |
| 6,714,817 B2 | 3/2004 | Daynes et al. | |
| 6,720,777 B2 | 4/2004 | Wang | |
| 6,730,863 B1 | 5/2004 | Gerpheide | |
| 6,731,121 B1 * | 5/2004 | Hsu et al. | 324/678 |
| 6,744,258 B2 * | 6/2004 | Ishio et al. | 324/548 |
| 6,750,852 B2 | 6/2004 | Gillespie | |
| 6,768,420 B2 | 7/2004 | McCarthy et al. | |
| 6,774,644 B2 | 8/2004 | Eberlein | |
| 6,788,221 B1 | 9/2004 | Ely et al. | |
| 6,788,521 B2 | 9/2004 | Nishi | |
| 6,798,218 B2 | 9/2004 | Kasperkovitz | |
| 6,809,275 B1 | 10/2004 | Cheng et al. | |
| 6,825,890 B2 | 11/2004 | Matsufusa | |
| 6,856,433 B2 | 2/2005 | Hatano et al. | |
| 6,873,203 B1 | 3/2005 | Latham, II et al. | |
| 6,879,215 B1 | 4/2005 | Roach | |
| 6,888,536 B2 | 5/2005 | Westerman et al. | |
| 6,888,538 B2 | 5/2005 | Ely et al. | |
| 6,893,724 B2 | 5/2005 | Lin et al. | |
| 6,903,402 B2 | 6/2005 | Miyazawa | |
| 6,904,570 B2 | 6/2005 | Foote et al. | |
| 6,914,547 B1 | 7/2005 | Swaroop et al. | |
| 6,933,873 B1 | 8/2005 | Horsley et al. | |
| 6,949,811 B2 | 9/2005 | Miyazawa | |
| 6,949,937 B2 * | 9/2005 | Knoedgen | 324/658 |
| 6,958,594 B2 | 10/2005 | Redl et al. | |
| 6,969,978 B2 | 11/2005 | Dening | |
| 6,970,126 B1 | 11/2005 | O'Dowd et al. | |
| 6,975,123 B1 | 12/2005 | Malang et al. | |
| 6,993,607 B2 | 1/2006 | Philipp | |

| | | | |
|---|---|---|---|
| 7,002,557 B2 | 2/2006 | Iizuka et al. | |
| 7,006,078 B2 | 2/2006 | Kim | |
| 7,006,938 B2 | 2/2006 | Laraia et al. | |
| 7,030,782 B2 | 4/2006 | Ely et al. | |
| 7,030,860 B1 | 4/2006 | Hsu et al. | |
| 7,032,051 B2 | 4/2006 | Reay et al. | |
| 7,046,230 B2 | 5/2006 | Zadesky et al. | |
| 7,068,039 B2 | 6/2006 | Parker | |
| 7,075,316 B2 | 7/2006 | Umeda et al. | |
| 7,075,864 B2 | 7/2006 | Kakitsuka et al. | |
| 7,109,978 B2 | 9/2006 | Gillespie et al. | |
| 7,119,550 B2 | 10/2006 | Kitano | |
| 7,133,140 B2 | 11/2006 | Lukacs et al. | |
| 7,133,793 B2 | 11/2006 | Ely et al. | |
| 7,141,968 B2 | 11/2006 | Hibbs et al. | |
| 7,141,987 B2 | 11/2006 | Hibbs et al. | |
| 7,148,704 B2 | 12/2006 | Philipp | |
| 7,151,528 B2 | 12/2006 | Taylor et al. | |
| 7,202,857 B2 | 4/2007 | Hinckley et al. | |
| 7,205,777 B2* | 4/2007 | Schulz et al. | 324/661 |
| 7,212,189 B2 | 5/2007 | Shaw et al | |
| 7,245,131 B2* | 7/2007 | Kurachi et al. | 324/663 |
| 7,253,643 B1 | 8/2007 | Seguine | |
| 7,254,775 B2 | 8/2007 | Geaghan et al. | |
| 7,288,946 B2 | 10/2007 | Hargreaves et al. | |
| 7,288,977 B2 | 10/2007 | Stanley | |
| 7,298,124 B2 | 11/2007 | Kan et al. | |
| 7,301,350 B2 | 11/2007 | Hargreaves et al. | |
| 7,307,485 B1 | 12/2007 | Snyder et al. | |
| 7,312,616 B2 | 12/2007 | Snyder | |
| 7,375,535 B1 | 5/2008 | Kutz et al. | |
| 7,466,307 B2 | 12/2008 | Trent et al. | |
| 7,499,040 B2 | 3/2009 | Zadesky et al. | |
| 7,515,140 B2 | 4/2009 | Philipp | |
| RE40,867 E | 8/2009 | Binstead | |
| 7,804,307 B1 | 9/2010 | Bokma et al. | |
| 2002/0063688 A1 | 5/2002 | Shaw et al. | |
| 2002/0191029 A1 | 12/2002 | Gillespie et al. | |
| 2003/0062889 A1 | 4/2003 | Ely et al. | |
| 2003/0080755 A1 | 5/2003 | Kobayashi | |
| 2003/0091220 A1 | 5/2003 | Sato et al. | |
| 2004/0178989 A1 | 9/2004 | Shahoian et al. | |
| 2005/0024341 A1 | 2/2005 | Gillespie et al. | |
| 2005/0031175 A1 | 2/2005 | Hara et al. | |
| 2005/0179668 A1 | 8/2005 | Edwards | |
| 2006/0022660 A1* | 2/2006 | Itoh | 323/312 |
| 2006/0032680 A1 | 2/2006 | Elias et al. | |
| 2006/0033508 A1* | 2/2006 | Lee | 324/678 |
| 2006/0049834 A1 | 3/2006 | Umeda | |
| 2006/0066582 A1 | 3/2006 | Lyon et al. | |
| 2006/0097991 A1 | 5/2006 | Hotelling et al. | |
| 2006/0176718 A1* | 8/2006 | Itoh | 363/60 |
| 2006/0193156 A1* | 8/2006 | Kaishita et al. | 363/123 |
| 2006/0273804 A1 | 12/2006 | Delorme et al. | |
| 2007/0046299 A1* | 3/2007 | Hargreaves et al. | 324/678 |
| 2007/0173220 A1 | 7/2007 | Kim et al. | |
| 2007/0176609 A1* | 8/2007 | Ely et al. | 324/678 |
| 2008/0088595 A1 | 4/2008 | Liu et al. | |
| 2008/0111714 A1 | 5/2008 | Kremin | |
| 2008/0158178 A1 | 7/2008 | Hotelling et al. | |
| 2008/0165134 A1 | 7/2008 | Krah | |
| 2008/0196945 A1 | 8/2008 | Konstas | |
| 2009/0002206 A1 | 1/2009 | Kremin | |
| 2009/0153152 A1 | 6/2009 | Maharyta et al. | |

OTHER PUBLICATIONS

U.S. Appl. No. 11/600,255: "Capacitance to Code Converter with Sigma-Delta Modulation," Viktor Kremin; filed on Nov. 14, 2006; 102 pages.

U.S. Appl. No. 11/709,897: "Preventing Unintentional Activation of a Sensor Element of a Sensing Device," Jason Konstas; filed on Feb. 21, 2007; 97 pages.

"Sigma-Delta ADCs and DACs, AN-283 Application Note, Analog Devices," 1993; Downloaded from <http://www.analog.com/UpoloadedFiles/Application_Notes/292524291525717245054923680458171AN283.pdf>; 16 pages.

Dave Van Ess, "Understanding Switched Capacitor Analog Blocks," AN2041, Application Note, Mar. 30, 2004; 16 pages.

Dennis Seguine, "Capacitive Switch Scan," AN2233a, Application Note, CY8C21x34, Apr. 7, 2005; 6 pages.

Mark Lee, "CapSense Best Practices," AN2394, Application Note, Oct. 19, 2006; 10 pages.

"CSD User Module Data Sheet," CSD v1.0, Oct. 23, 2006; 58 pages.

Vladislav Golub, Ph. D., "Sigma-delta ADCs," Jun. 17, 2003; 10 pages.

Sangil Park, Ph. D., Motorola Digital Signal Processors "Principles of Sigma-Delta Modulation for Analog-to-Digital Converters," APR8/D Rev. 1; Downloaded from <http://digitalsignallabs.com/SigmaDelta.pdf>; 64 pages.

Ryan Seguine et al., "Layout Guidelines for PSoC CapSense," Cypress Application Note AN2292, Revision B, Oct. 31, 2005; 15 pages.

"CSR User Module Data Sheet," CSR v1.0, CY8C21x34 Data Sheet Oct. 6, 2006; 36 pages.

USPTO Notice of Allowance for U.S. Appl. No. 11/230,719 dated Jan. 16, 2008; 4 pages.

USPTO Advisory Action for U.S. Appl. No. 11/230,719 dated Nov. 30, 2007; 3 pages.

USPTO Final Rejection for U.S. Appl. No. 11/230,719 dated Sep. 7, 2007; 9 pages.

USPTO Non-Final Rejection for U.S. Appl. No. 11/230,719 dated May 25, 2007; 6 pages.

USPTO Non-Final Rejection for U.S. Appl. No. 11/230,719 dated Jan. 16, 2007; 8 pages.

USPTO Non-Final Rejection for U.S. Appl. No. 11/230,719 dated Aug. 28, 2006; 7 pages.

USPTO Non-Final Rejection for U.S. Appl. No. 11/230,719 dated May 11, 2006; 5 pages.

USPTO Notice of Allowance for U.S. Appl. No. 11/823,982 dated Feb. 1, 2010; 8 pages.

USPTO Notice of Allowance for U.S. Appl. No. 11/823,982 dated Oct. 6, 2009; 12 pages.

USPTO Non-Final Rejection for U.S. Appl. No. 11/823,982 dated Mar. 19, 2009; 14 pages.

USPTO Non-Final Rejection for U.S. Appl. No. 12/166,228 dated Dec. 30, 2009; 11 pages.

USPTO Notice of Allowance for U.S. Appl. No. 11/273,708 dated Aug. 9, 2007; 4 pages.

USPTO Final Rejection for U.S. Appl. No. 11/273,708 dated Jul. 5, 2007; 8 pages.

USPTO Non-Final Rejection for U.S. Appl. No. 11/273,708 dated Mar. 19, 2007; 16 pages.

USPTO Notice of Allowance for U.S. Appl. No. 11/337,272 dated Aug. 15, 2007; 9 pages.

USPTO Non-Final Rejection for U.S. Appl. No. 11/337,272 dated May 17, 2007; 11 pages.

USPTO Advisory Action for U.S. Appl. No. 11/337,272 dated Apr. 3, 2007; 3 pages.

USPTO Final Rejection for U.S. Appl. No. 11/337,272 dated Feb. 2, 2007; 11 pages.

USPTO Non-Final Rejection for U.S. Appl. No. 11/337,272 dated Oct. 24, 2006; 9 pages.

USPTO Notice of Allowance for U.S. Appl. No. 11/983,291 dated Oct. 22, 2009; 7 pages.

USPTO Final Rejection for U.S. Appl. No. 11/983,291 dated Aug. 12, 2009; 10 pages.

USOPTO Non-Final Rejection for U.S. Appl. No. 11/983,291 dated Mar. 9, 2009; 9 pages.

Sedra et al., "Microelectronic Circuits," 3rd Edition, 1991, Oxford University Press, Feb. 5, 2007; 20 pages.

Van Ess, David; "Simulating a 555 Timer with PSoC," Cypress Semiconductor Corporation, Application Note AN2286, May 19, 2005; 10 pages.

Cypress Semiconductor Corporation, "FAN Controller CG6457AM and CG6462AM," PSoC Mixed Signal Array Preliminary Data Sheet; May 24, 2005; 25 pages.

Cypress Semiconductor Corporation, "PSoC Mixed-Signal Controllers," Production Description; <http://www.cypress.com/portal/server>; retrieved on Sep. 27, 2005; 2 pages.

Chapweske, Adam; "The PS/2 Mouse Interface," PS/2 Mouse Interfacing, 2001, retrieved on May 18, 2006; 11 pages.

Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.

Seguine, Ryan; "Layout Guidelines for PSoC CapSense," Cypress Semiconductor Corporation, Application Note AN2292; Jul. 22, 2005; 13 pages.

Lee, Mark; "Emc Design Considerations for PSoC CapSense Applications," Cypress Semiconductor Corporation, Application Note AN2318; Sep. 16, 2005; 6 pages.

Cypress Semiconductor Corporation, "PSoC CY8C20x34 Technical Reference Manual (TRM)," PSoC CY8C20x34 TRM, Version 1.0, 2006; 220 pages.

Cypress Semiconductor Corporation, "Release Notes sm017," Jan. 24, 2007; 3 pages.

Larry K. Baxter, "Capacitive Sensors, Design and Applications," IEEE Press, The Institute of Electrical and Electronics Engineers Inc., Aug. 1996, pp. 177-187; 12 pages.

International Search Report of the International Searching Authority for International Application No. PCT/US2008/013622 mailed Feb. 9, 2009; 2 pages.

Written Opinion of the International Searching Authority for International Application No. PCT/US2008/013622 mailed Feb. 9, 2009; 5 pages.

Min et al., "Offset Compensation of Capacitive Sensors for Electrostatic Microactuators," ISIE 2001, IEEE, Pusan Korea, pp. 2114-2117; 4 pages.

USPTO Notice of Allowance for U.S. Appl. No. 11/983,291 dated Mar. 9, 2010; 7 pages.

USPTO Non-Final Rejection for U.S. Appl. No. 11/600,255 dated Mar. 29, 2010; 10 pages.

USPTO Non-Final Rejection for U.S. Appl. No. 11/709,897 dated Feb. 16, 2010; 21 pages.

USPTO Final Rejection for U.S. Appl. No. 12/166,228 dated May 28, 2010; 12 pages.

USPTO Final Rejection for U.S. Appl. No. 11/709,897 dated Jul. 29, 2010; 24 pages.

USPTO Notice of Allowance for U.S. Appl. No. 11/600,255 dated Jul. 27, 2010; 6 pages.

USPTO Non-Final Rejection for U.S. Appl. No. 12/166,228 dated Aug. 11, 2010; 8 pages.

USPTO Final Rejection for U.S. Appl. No. 12/166,228 dated Jul. 1, 2008; 9 pages.

USPTO Non-Final Rejection for U.S. Appl. No. 11/442,212 dated Feb. 25, 2011; 13 pages.

USPTO Final Rejection for U.S. Appl. No. 12/166,228 dated Jan. 4, 2011; 9 pages.

USPTO Notice of Allowance for U.S. Appl. No. 12/166,228 dated Mar. 22, 2011; 8 pages.

Kremin, V. "Noise resistant capacitive sensor," U.S. Appl. No. 11/8244,249 filed Jun. 29, 2007.

USPTO Final Rejection for U.S. Appl. No. 11/442,212 dated Jun. 7, 2011; 14 pages.

USPTO Non-Final Rejection for U.S. Appl. No. 11/442,212 dated Feb. 25, 2011; 13 pages.

USPTO Advisory Action for U.S. Appl. No. 11/442,212 dated Jan. 5, 2011; 3 pages.

USPTO Final Rejection for U.S. Appl. No. 11/442,212 dated Oct. 13, 2010; 13 pages.

USPTO Non-Final Rejection for U.S. Appl. No. 11/442,212 dated Jul. 6, 2010; 13 pages.

USPTO Advisory Action for U.S. Appl. No. 11/442,212 dated Dec. 17, 2009; 3 pages.

USPTO Final Rejection for U.S. Appl. No. 11/442,212 dated Oct. 2, 2009; 12 pages.

USPTO Non-Final Rejection for U.S. Appl. No. 11/442,212 dated Mar. 31, 2009; 12 pages.

USPTO Notice of Allowance for U.S. Appl. No. 11/489,944 dated Apr. 9, 2007; 7 pages.

USPTO Non-Final Rejection for U.S. Appl. No. 11/824,249 dated May 25, 2011; 9 pages.

USPTO Requirement Restriction for U.S. Appl. No. 11/824,249 dated Feb. 17, 2011; 5 pages.

USPTO Notice of Allowance for U.S. Appl. No. 11/600,255 dated Dec. 9, 2010; 6 pages.

USPTO Notice of Allowance for U.S. Appl. No. 11/600,255 dated Apr. 20, 2011; 7 pages.

USPTO Notice of Allowance for U.S. Appl. No. 11/600,255 dated Jun. 16, 2011; 7 pages.

U.S. Appl. No. 13/049,798 "Capacitance to Code Converter With Sigma-Delta Modulator," Kremin, filed on Mar. 16, 2011, 77 pages.

USPTO Non-Final Rejection for U.S. Appl. No. 12/040,387 dated Jun. 30, 2011; 12 pages.

USPTO Requirement for Restriction for U.S. Appl. No. 12/395,462 dated May 13, 2011; 6 pages.

USPTO Non-Final Rejection for U.S. Appl. No. 12/395,462 dated Aug. 23, 2011; 5 pages.

USPTO Final Rejection for U.S. Appl. No. 12/239,692 dated May 9, 2011; 10 pages.

USPTO Non-Final Rejection for U.S. Appl. No. 12/239,692 dated Nov. 29, 2010; 9 pages.

USPTO Requirement for Restriction for U.S. Appl. No. 12/239,692 dated Sep. 27, 2010; 7 pages.

USPTO Advisory Action for U.S. Appl. No. 12/332,980 dated Aug. 9, 2011; 3 pages.

USPTO Final Rejection for U.S. Appl. No. 12/332,980 dated May 31, 2011; 11 pages.

USPTO Non-Final Rejection for U.S. Appl. No. 12/332,980 dated Dec. 22, 2010; 9 pages.

USPTO Non-Final Rejection for U.S. Appl. No. 12/606,147 dated Aug. 23, 2011; 6 pages.

* cited by examiner

CHARGE ACCUMULATION CAPACITANCE SENSOR WITH LINEAR TRANSFER CHARACTERISTIC

TECHNICAL FIELD

Embodiments of the invention relate to the field of user interface devices and, in particular, to capacitive touch-sensor devices.

BACKGROUND

Computing devices, such as notebook computers, personal data assistants (PDAs), mobile handsets and the like, all have user interface devices. One class of user interface device that has become more common is based on capacitive touch-sensor technology utilizing touch-sensitive capacitors. Touch-sensitive capacitors may be used to implement touch-sensor pads, such as the familiar mouse pad in notebook computers, non-mechanical slider controls (e.g., a volume control) and non-mechanical push-button controls.

FIG. 1A illustrates a typical touch-sensor pad 100. The touch-sensor pad 100 includes a sensing surface 101 on which a conductive object may be used to position a cursor in the x- and y-axes, or to select an item on a display. Touch-sensor pad 100 may also include two buttons, left and right buttons 102 and 103, respectively, which may operate as touch-sensitive switches.

FIG. 1B illustrates a conventional linear touch-sensor slider ("slider") that might be used as a linear control such as a volume control, for example. The slider 110 includes a number of conductive sensor elements 111 separated by insulating gaps 112, where each sensor element is an electrode of a capacitor. Typically, a dielectric material (not shown) is overlaid on top of the sensor elements to prevent any direct electrical conduction between the sensor elements and/or a conductive object when the conductive object is placed on the slider. When a conductive object contacts or comes in proximity to one of the sensor elements, a capacitance associated with the sensor element (or with an adjacent pair of sensor elements) is changed. The change in capacitance can be detected and sent as a signal to a processing device. As a finger or other conductive object moves across the slider, the changing capacitance of each sensor element is detected to pinpoint the location and motion of the conductive object. This same principle (i.e., detecting capacitance changes) can also be used to implement touch sensor buttons (e.g., on-off controls).

FIG. 2A illustrates one form of a touch sensitive capacitor 300. In its basic form, the touch sensitive capacitor 300 includes a pair of adjacent plates 301 and 302. There is a small edge-to-edge (fringing) capacitance $C_f$ between the plates. When a conductive object 303 (e.g., a finger) is placed in proximity to the two plates 301 and 302, there is a capacitance between the conductive object and each of the plates. If the capacitance between the conductive object and each plate is defined as $2*C_S$, then the total capacitance between the plates due to the presence of the conductive object is $C_S$ (the series combination of the two separate capacitances). This capacitance adds in parallel to the fringing capacitance $C_f$ between the plates 301 and 302, resulting in a change in total capacitance equal to $C_S$.

FIG. 2B illustrates another form of a touch sensitive capacitor 307 where two parallel plates 305 are separated by a dielectric layer 308 and one of the plates is grounded. Typically, the ungrounded plate is covered by a second dielectric layer 304. The parallel plate capacitance between the two plates 305 is denoted by $C_{PP}$. When the conductive object 303 approaches or contacts dielectric layer 304, a capacitance $C_S$ is created between the conductive object and the ungrounded plate. As a result, the total capacitance from the ungrounded plate to ground is given by the sum of the capacitances $C_{PP}+C_S$ (the conductive object need not be actually grounded for the touch sensitive capacitor to operate; a human finger, for example, is connected to a person's body capacitance, which can act as a virtual ground). Detecting a touch is then a matter of measuring the change in capacitance from $C_{PP}$ to ($C_{PP}+C_S$). In a typical touch sensitive capacitor, $C_S$ may range from approximately 10 to 30 picofarads (pF), although other ranges may be used. While the conductive object illustrated here is a finger, any conductive object may be used (e.g., a stylus).

A variety of different circuits have been developed that can be used to detect and/or measure the capacitance and/or capacitance changes of touch sensitive capacitors. These circuits include capacitance sensing relaxation oscillators, resistor-capacitor phase shift circuits, resistor-capacitor time constant circuits, capacitive voltage dividers and capacitive charge transfer circuits.

FIG. 3A illustrates a conventional charge transfer circuit. In FIG. 3A, $C_X$ is the touch-sensitive capacitance being sensed and $C_{INT}$ is a summing (integration) capacitor. The operation of the circuit is relatively simple. At the start of the measurement cycle, any charge on $C_{INT}$ is discharged by momentarily turning on switch SW3. Switches SW1 and SW2 are operated in a non-overlapping way during the rest of the measurement cycle. First, SW1 is turned on, charging $C_X$ to the supply voltage $V_{DD}$. The charge on $C_X$ is given by:

$$Q_X = C_X V_{DD}$$

Next, SW1 is turned off and SW2 is turned on, causing the charge on $C_X$ to be distributed between $C_X$ and $C_{INT}$, which lowers the voltage on $C_X$ and raises the voltage on $C_{INT}$. This operation is repeated multiple times, causing the output voltage to increase asymptotically toward $V_{DD}$. The equation for the output voltage on the nth iteration is given by:

$$V_{OUT}(n) = V_{OUT}(n-1) + \left[V_{DD} - V_{OUT}(n-1)\frac{C_X}{C_{INT}}\right]$$

This recursive equation has an exponential solution given by:

$$V_{OUT} = V_{DD}\left(1 - e^{-\frac{nC_X}{C_{INT}}}\right)$$

which is illustrated in FIG. 3B. The value of $C_X$ can be determined by counting the number of iterations that are needed for $V_{OUT}$ to reach a specified threshold voltage $V_{TH}$:

$$n = -\frac{C_{INT}}{C_X}\ln\left(1 - \frac{V_{TH}}{V_{DD}}\right)$$

The value of $C_X$ is then given by:

$$C_X = -\frac{C_{INT}}{n}\ln\left(1 - \frac{V_{TH}}{V_{DD}}\right)$$

Conversely, the output voltage can be measure after a specified number of iterations (n=N), in which case the value of $C_X$ is given by:

$$C_X = -\frac{C_{INT}}{N}\ln\left(1 - \frac{V_{OUT}}{V_{DD}}\right)$$

In both cases, the value of $C_X$ is a nonlinear function of n and $V_{OUT}$. As a result, either extra circuitry is required to linearize the output or lookup tables are needed to map the nonlinear function to linear values. Either approach increases the complexity and cost of the sensor circuitry.

BRIEF DESCRIPTION OF THE DRAWINGS

The present invention is illustrated by way of example, and not by way of limitation, in the figures of the accompanying drawings.

DETAILED DESCRIPTION

Described herein are methods and apparatus for determining the capacitance of a capacitive touch-sensor, including means for transferring charge from a sense capacitor to a charge accumulation capacitor, and means for linearizing charge accumulation on the charge accumulation capacitor to determine a value of the sense capacitor.

The following description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

In the following description, the term "capacitive touch sensor" is used to denote any device, assembly and/or component that exhibits a change in capacitance due to the contact or proximity of a conductive or dielectric object and includes, but is not limited to touch sensitive pads, touch sensitive sliders and touch sensitive buttons. As used herein, the term "touch sensitive capacitor" denotes a single capacitive element that may be a component of a capacitive touch sensor such as a touch sensitive pad and/or a touch sensitive slider, or that may function as a touch sensitive switch and/or non-mechanical pushbutton. The term "capacitance sensor," as used herein, includes but is not limited to, any component, system or subsystem that is capable of detecting and/or measuring capacitance and/or changes in capacitance (such as the change in capacitance of a touch sensitive capacitor, for example).

In one embodiment, a method for determining the capacitance of a touch sensitive capacitor includes (a) charging a first capacitor to a first voltage, where the first voltage on the first capacitor is the sum of a second voltage on a second capacitor and an offset voltage, and (b) transferring charge from the first capacitor to the second capacitor, where the first voltage on the first capacitor and the second voltage on the second capacitor are equalized.

In one embodiment, the method includes repeating steps (a) and (b) for a number of cycles until the second voltage on the second capacitor crosses a threshold voltage, and determining a value of the first capacitor from a count of the number of cycles.

In one embodiment, the method includes repeating steps (a) and (b) for n cycles and determining a value of the first capacitor from the second voltage on the second capacitor after the n cycles.

Figure 1A:
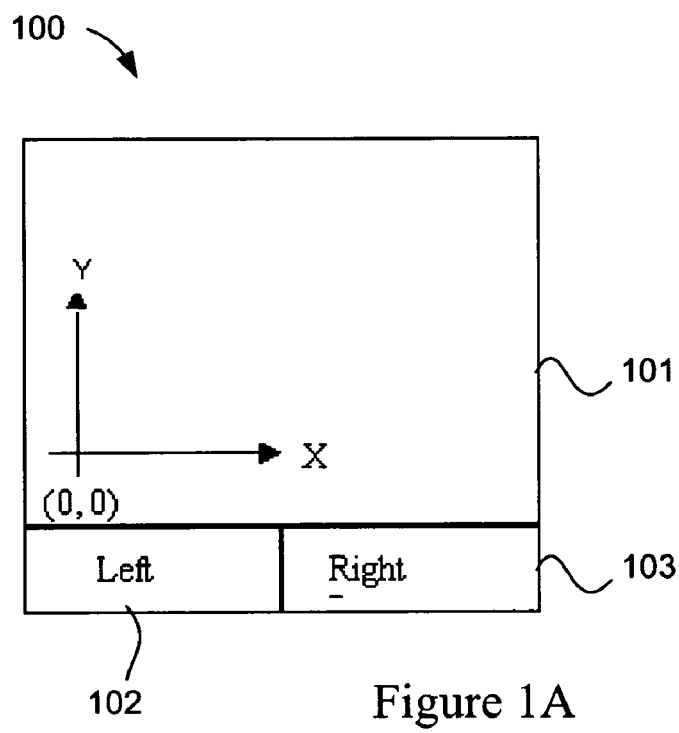
FIG. 1A illustrates a conventional touch-sensor pad.
Figure 1B:
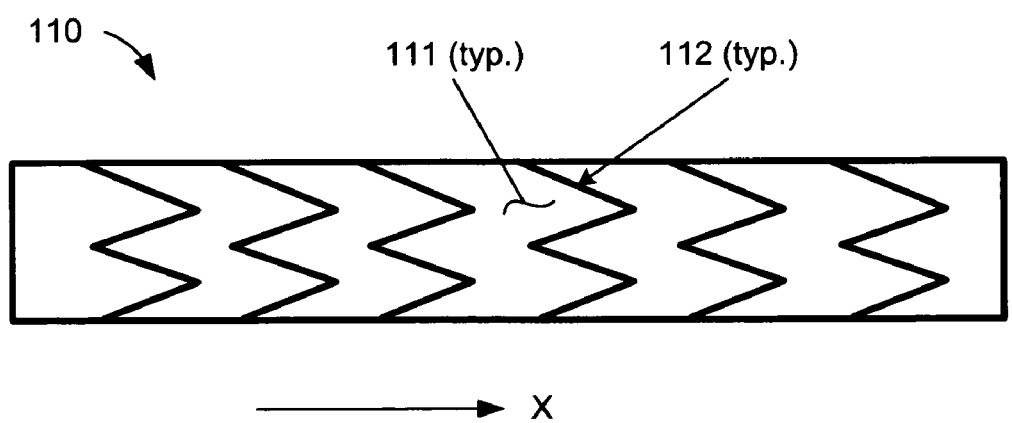
FIG. 1B illustrates a conventional linear touch-sensor slider.
Figure 2A:
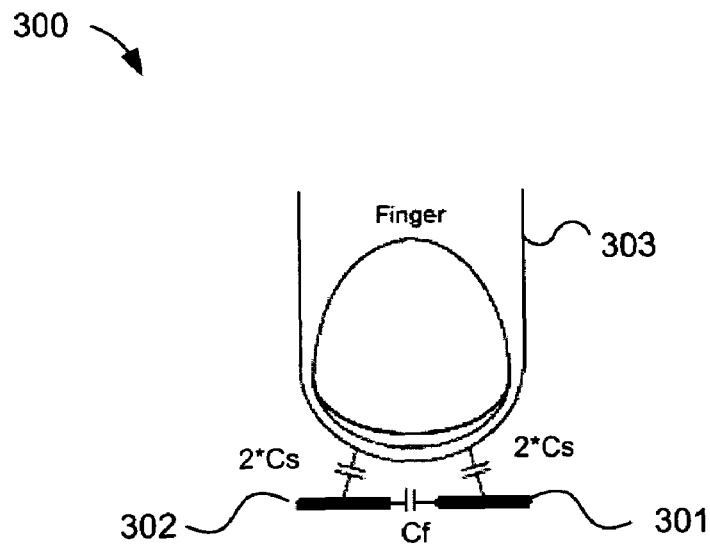
FIG. 2A illustrates one form of a touch-sensitive capacitor.
Figure 2B:
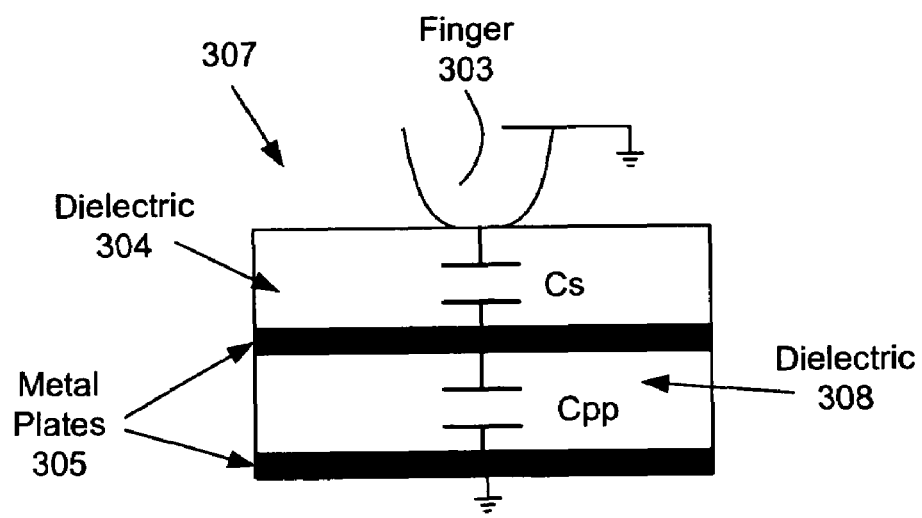
FIG. 2B illustrates another form of a touch-sensitive capacitor.
Figure 3A:
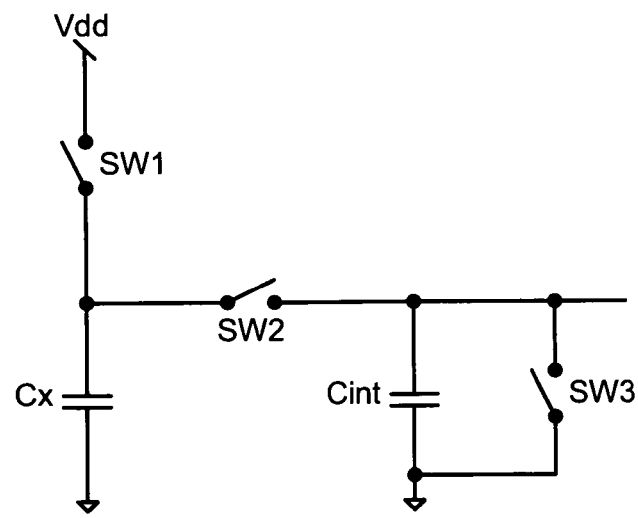
FIGS. 3A-3B illustrate aspects of a conventional charge transfer capacitance sensor.
Figure 3B:
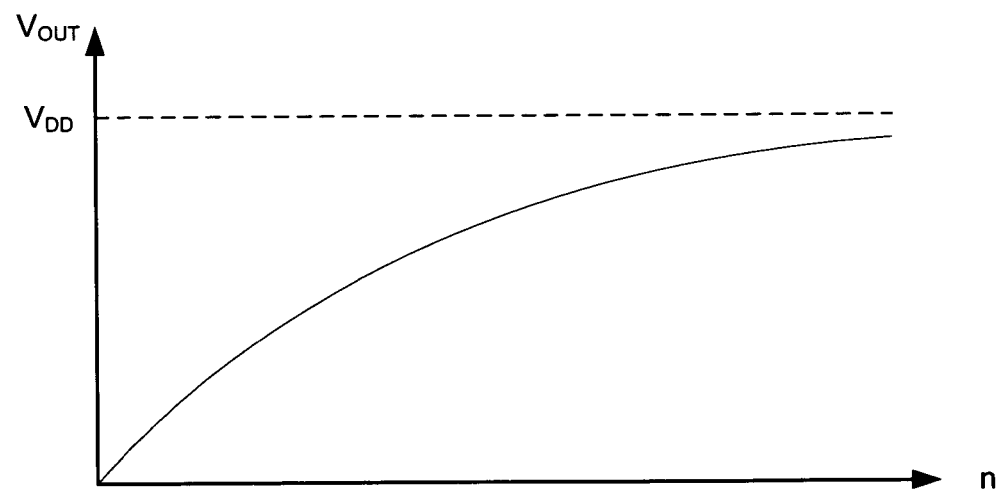
Figure 4A:
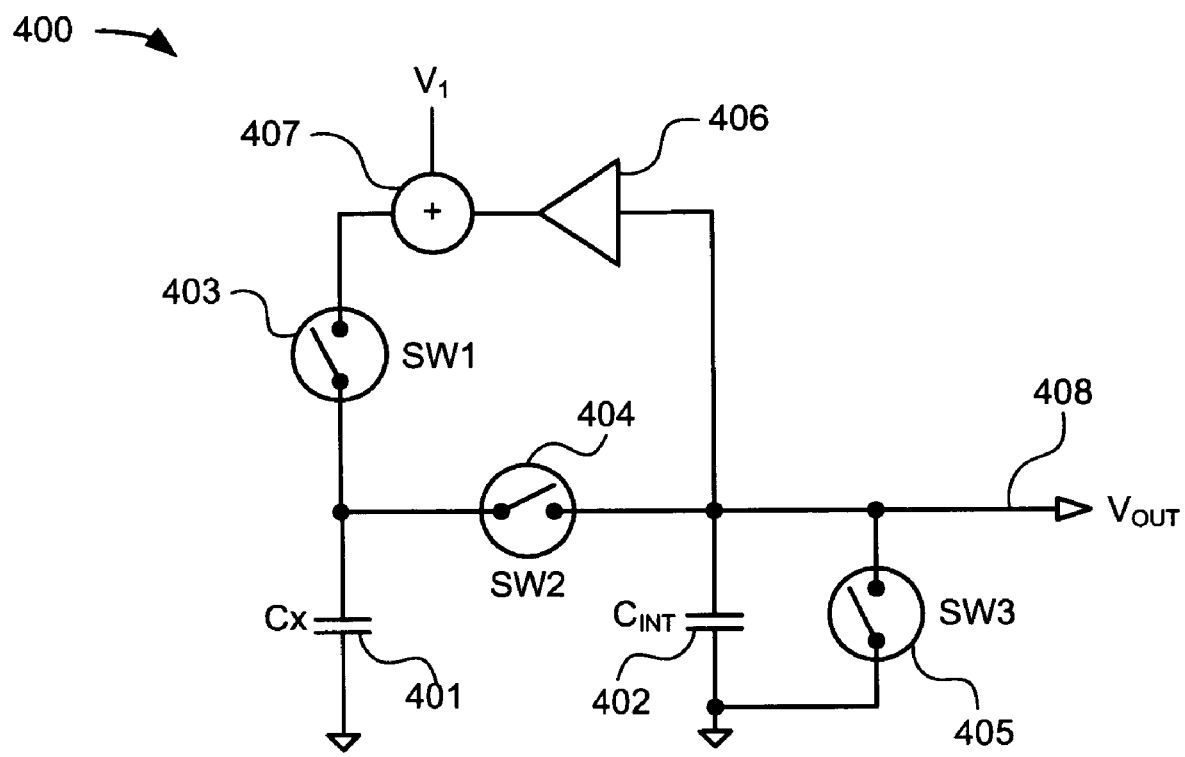
FIG. 4A illustrates one embodiment of a linear charge transfer circuit.

FIG. 4A illustrates a linear charge transfer capacitance sensor 400 in one embodiment for sensing the capacitance of a touch-sensitive capacitance 401. Linear charge transfer circuit 400 includes a switch 405 (SW3) that operates as a reset switch to zero the initial charge on integration capacitor 402 ($C_{INT}$).

Sensor 400 also includes a buffer amplifier 406 (A1) and an adder 407, which may be a summing amplifier, for example. Adder 407 may be configured to operate as an inline voltage source. The input of buffer amplifier 406 is coupled to integration capacitor 402 and the output of buffer amplifier 406 is coupled to one input of adder 407. The other input of adder 407 is coupled to a voltage source V1. Voltage source V1 may be any type of voltage source known in the art. In one embodiment, voltage source 407 may be a bandgap voltage source. The output of adder 407, which is the sum of V1 and the output of buffer amplifier 406, is selectively connectable to sense capacitor 401 through switch 403 (SW1) and integration capacitor 402 is selectively connectable to sense capacitor 401 through switch 404 (SW2). Switches 402, 403 and 404 may be any type of solid-state switch, such as diode switches or transistor switches, for example. Switches 402-404 may be controlled by control circuitry (not shown) as is known in the art. In particular, switches 403 and 404 may be controlled to operate out of phase, in a break before make fashion, such that switch 403 is on when switch 404 is off and switch 403 is on when switch 404 is off. Alternatively, switches 403 and 404 may be replaced by a single-pole double-throw switch (not shown) that switches sense capacitor 401 between adder 407 and integration capacitor 402. In the following description, it is assumed that $C_{INT}$ is much greater than $C_X$ (e.g., $C_{INT} > 1000 C_X$)

If A1 is a unity gain amplifier, then when SW1 is turned on and SW2 is turned off:

$$V_{C_X} = V_{C_{INT}} + V_1$$

$$Q_{C_X} = V_{C_X} \cdot C_X = (V_{C_{INT}} + V_1) \cdot C_X$$

$$Q_{C_{INT}} = V_{C_{INT}} \cdot C_{INT}$$

where V is voltage and Q is charge.

When SW1 is turned off and SW2 is turned on, charge on $C_X$ and $C_{INT}$ is redistributed between $C_X$ and $C_{INT}$, such that:

$$V_{OUT} = V_{C_X} = V_{C_{INT}} = \frac{Q_{C_X} + Q_{C_{INT}}}{C_X + C_{INT}}$$

At the start of a measurement cycle, $C_{INT}$ is discharged through SW3, so that $V_{OUT} = 0$ and the output of A1 is also zero, so the output of adder 407 is $V_1$. On the first charge transfer cycle (n=1) between $C_X$ and $C_{INT}$, when $V_{OUT}$ is initially zero, the output will be given by (for $C_{INT} \gg C_X$):

$$V_{OUT} = V_1 \cdot \frac{C_X}{C_{INT}}$$

and the charge on $C_{INT}$ will be given by:

$$Q_{C_{INT}} = V_1 \cdot C_X$$

On the second charge transfer cycle (n=2), when SW2 is off and SW1 is on:

$$V_{C_x} = V_{C_{I_{NT}}} + V_1 = V_1 \cdot \frac{C_x}{C_{INT}} + V_1$$

$$Q_{C_x} = C_x \cdot V_1 \cdot \left( \frac{C_x}{C_{INT}} + 1 \right)$$

When SW1 is turned off and SW2 is turned on:

$$Q_{C_x + C_{INT}} = C_x \cdot V_1 \cdot \left( \frac{C_x}{C_{INT}} + 1 \right) + C_x \cdot V_1$$

$$V_{C_x + C_{INT}} = C_x \cdot V_1 \cdot \left( \frac{C_x}{C_{INT}^2} + \frac{2}{C_{INT}} \right)$$

If $C_{INT} \gg C_X$, as assumed, then $$\frac{C_x}{C_{INT}^2} \to 0,$$

and we have:

$$V_{C_{INT}} = 2 \cdot V_1 \cdot \frac{C_x}{C_{INT}}$$

It can be shown, in general, that after N charge transfer cycles, the output voltage will be:

$$V_{OUT}(N) = V_{C_{INT}}(N) = N \cdot V_1 \cdot \frac{C_x}{C_{INT}}$$

Figure 4B:
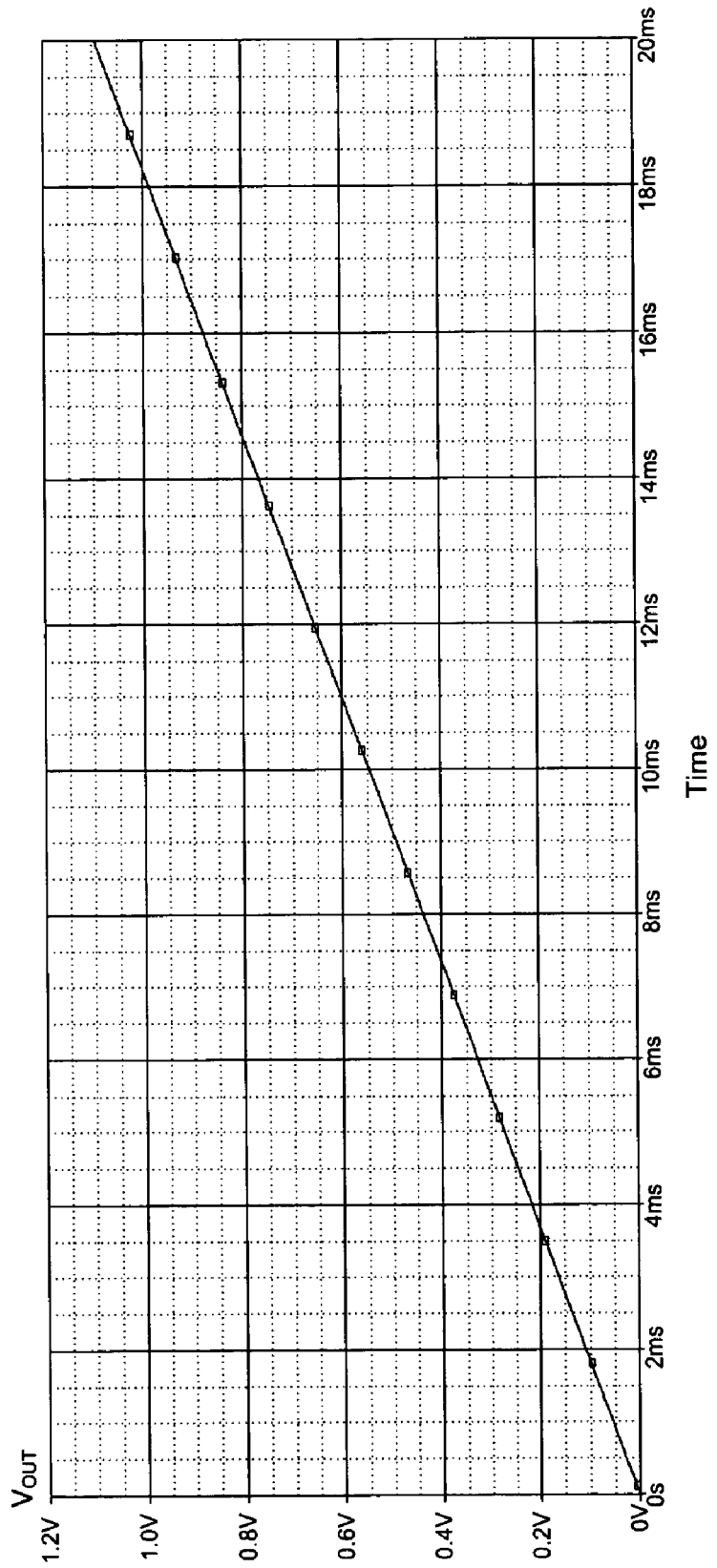
FIG. 4B illustrates the output voltage of one embodiment of the circuit of FIG. 4A.

That is, the output voltage is a linear function of N. FIG. 4B illustrates $V_{OUT}$ versus time for an example case where $V_1 = 1.2$ volts (a common bandgap voltage), $C_{INT} = 1000$ nF, $C_X = 10$ pF and N=1000 where each charge transfer cycle period is T=20 μs (SW1 and SW2 switching cycle, i.e., a switching frequency of 50 KHz).

The value of $C_X$ can therefore be expressed as:

$$C_x = \frac{C_{INT}}{N \cdot V_1} \cdot V_{OUT}(N)$$

The value of $C_X$ can then be determined by measuring $V_{OUT}$ after a specified number of charge transfer cycles N, or by counting the number of charge transfers that are required for the output voltage to reach a specified threshold voltage. It can be seen that if the value of $C_X$ changes, due to the presence of a finger or other object, to $C_X'$; then for a given output voltage, there will be a corresponding change in the number of charge transfer cycles to N'. If $C_X' - C_X = \Delta C_X$ and $N' - N = \Delta N$, then $$\frac{\Delta N}{N'} = -\frac{\Delta C_x}{C_x}$$

Therefore, a touch can be sensed by counting a change in the number of charge transfer cycles required to achieve a given output voltage, and the count change is inversely proportional to the capacitance change. That is, as the capacitance increases, the number of counts required to reach a specific output voltage decreases.

Figure 5A:
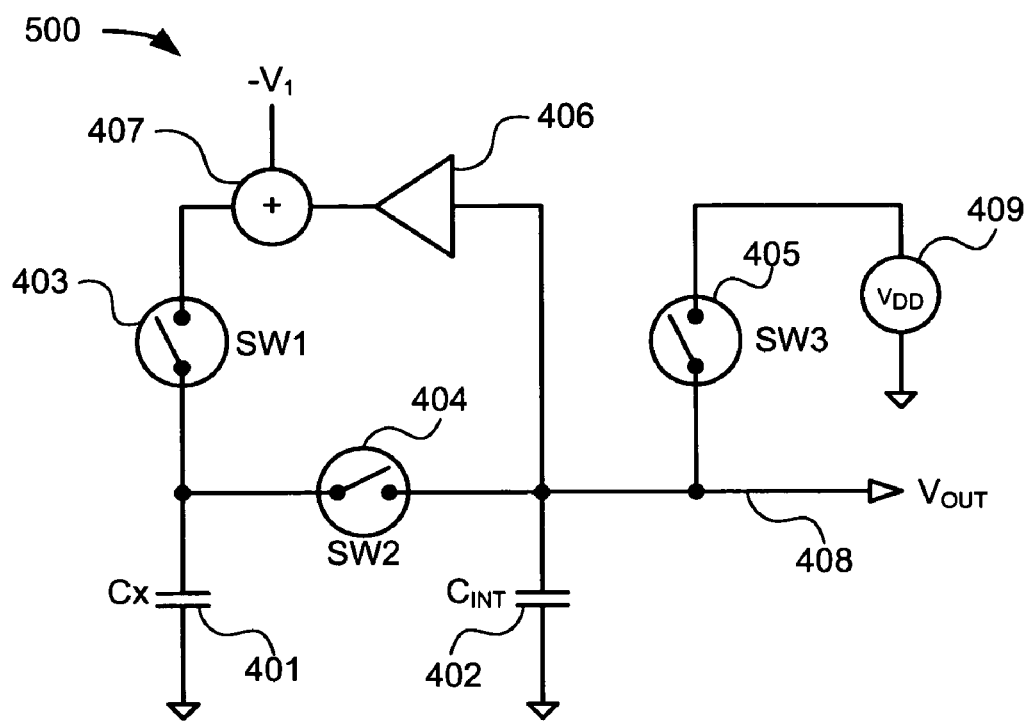
FIG. 5A illustrates another embodiment of a linear charge transfer circuit.

FIG. 5A illustrates an alternative embodiment of a linear charge transfer sensor 500, where the output voltage is referenced to a supply voltage $V_{DD}$ rather than ground and offset voltage source $V_1$ is replaced with $-V_1$. In the case of sensor 500, it can be shown that the output voltage is given by:

$$V_{C_{INT}} = V_{DD} - NV_1 \frac{C_x}{C_{INT}}$$

Figure 5B:
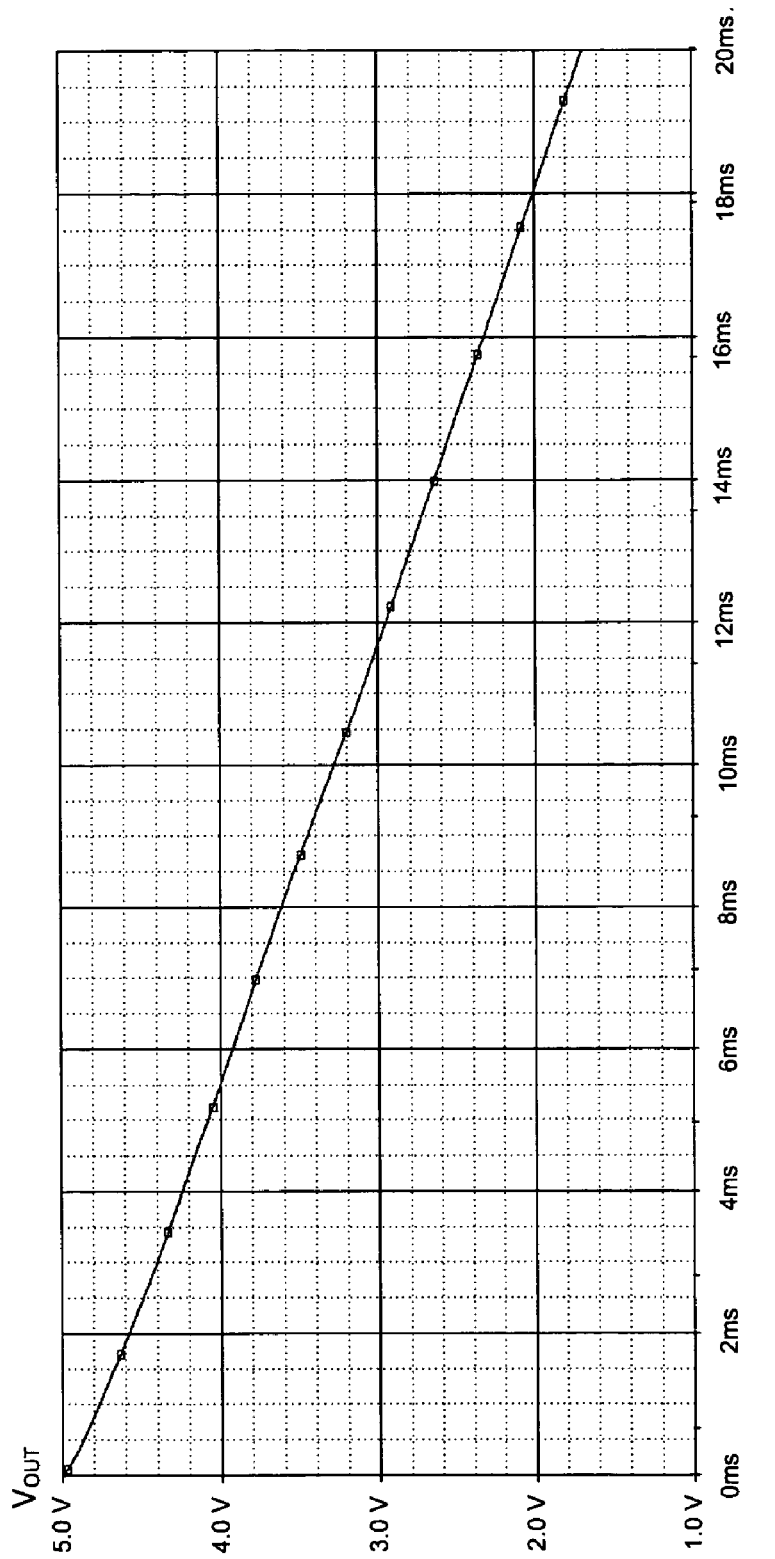
FIG. 5B illustrates the output voltage of the embodiment of the circuit of FIG. 5A.

FIG. 5B is a graph illustrating the output voltage of sensor 500 for $V_1 = 1.2$ volts, $V_{DD} = 5.0$ volts, $C_{INT} = 1000$ nF, $C_X = 10$ pF, T=20 μs (SW1 and SW2 switching cycle) and N=1000.

FIG. 6A illustrate an alternative embodiment of a linear charge transfer sensor 600, where the sense capacitor $C_X$ is floating (i.e., not grounded) which may be applicable to certain types of touch-sensitive capacitive devices. The equation governing the output of sensor 600 is the same as the equation for sensor 500.

Figure 6:
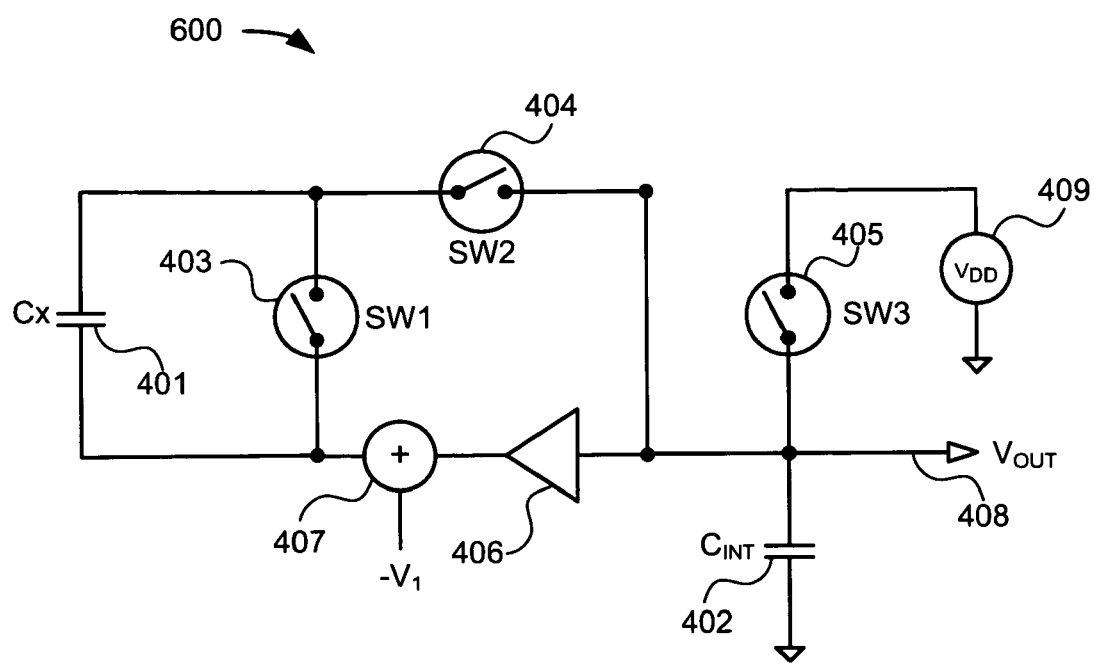
FIG. 6 illustrates another embodiment of a linear charge transfer circuit.

It will be appreciated that, in FIGS. 4A, 5 and 6, the positions of buffer amplifier 406 and adder 407 may be interchanged if the adder 407 has a high impedance input (such that $C_{INT}$ is not loaded)

Figure 10:
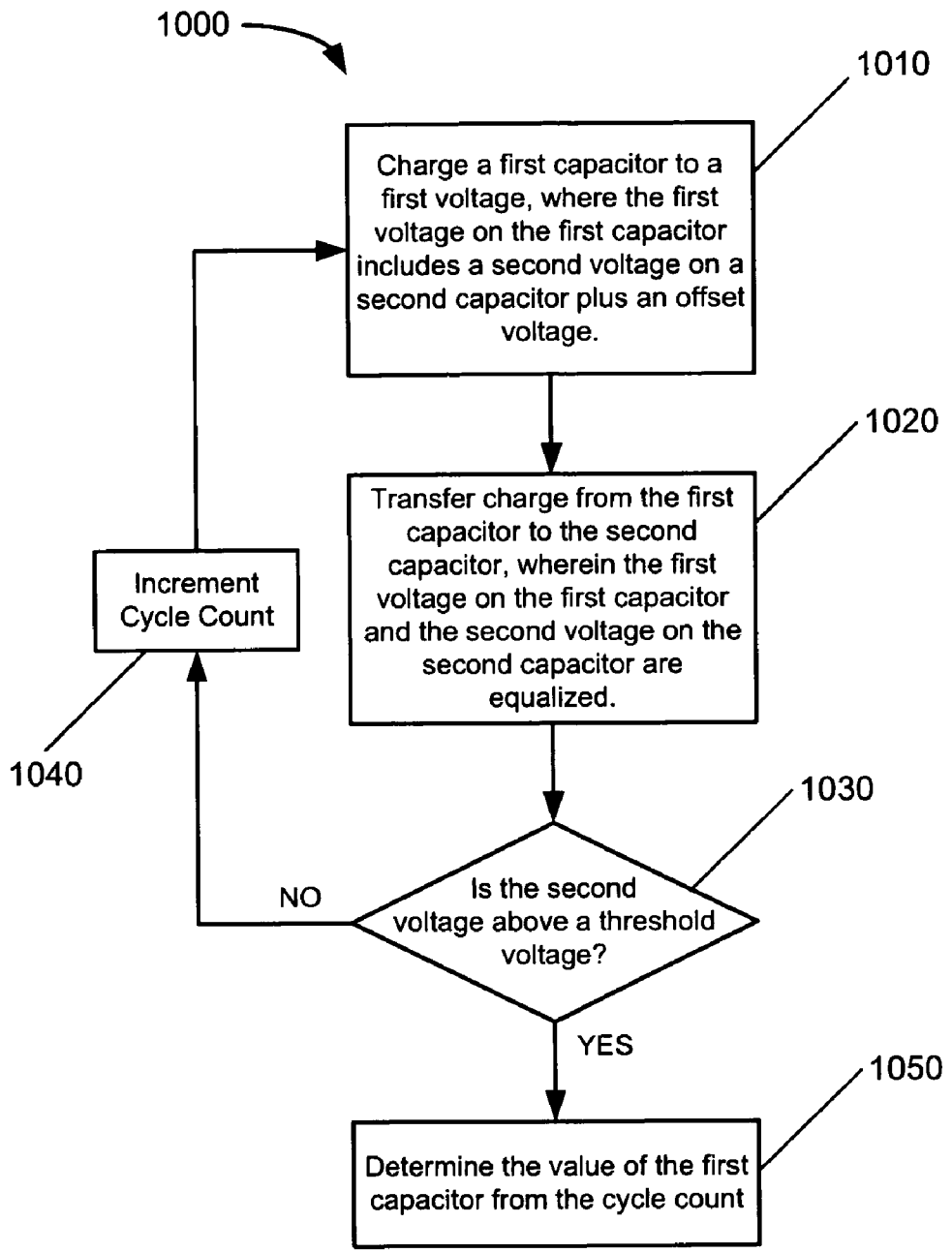
FIG. 10 is a flowchart illustrating a method of capacitance measurement using linear charge transfer in one embodiment.

FIG. 10 is a flowchart illustrating a method 1000 for linear charge transfer according to one embodiment. With reference to FIGS. 4A, 5 and 6, the method begins at operation 1010 by charging a first capacitor (e.g., capacitor 401) to a first voltage, where the first voltage on the first capacitor includes a second voltage (e.g., voltage 408) on a second capacitor (e.g., capacitor 402) plus an offset voltage (e.g., V1). The method continues at operation 1020 by transferring charge from the first capacitor to the second capacitor, where the first voltage on the first capacitor and the second voltage on the second capacitor are equalized. At operation 1030, it is determined if the second voltage is above a threshold voltage. If the second voltage is not above the threshold voltage, then a cycle counter is incremented in operation 1040, and operations 1010 and 1020 are repeated. If the second voltage is above the threshold voltage at operation 1030, then the value of the first capacitor is determined from the cycle count at operation 1050.

Figure 11:
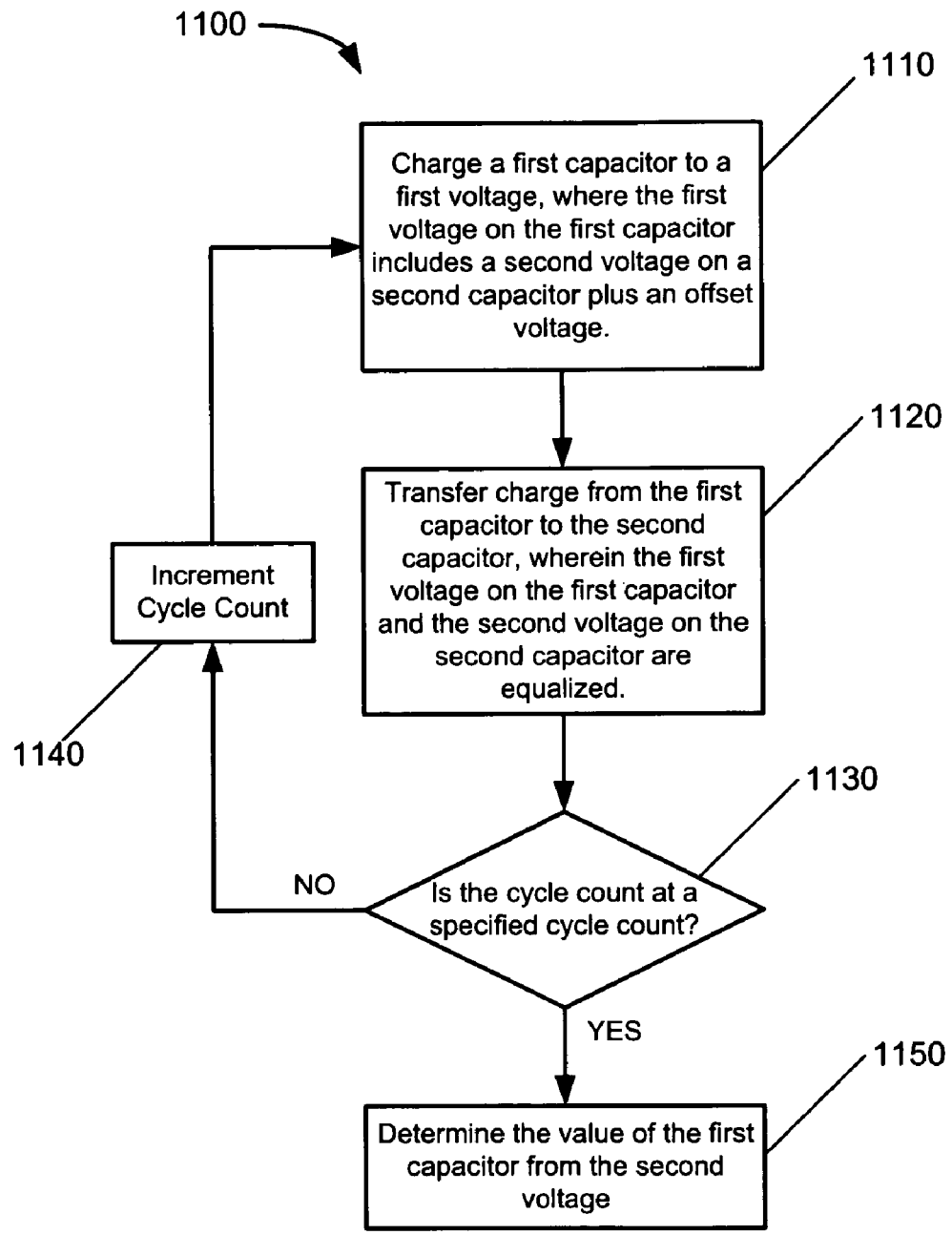
FIG. 11 is a flowchart illustrating another method of capacitance measurement using linear charge transfer in one embodiment.

FIG. 11 is a flowchart illustrating a method 1100 for linear charge transfer according to another embodiment. With reference to FIGS. 4A, 5A and 6A, the method begins at operation 1110 by charging a first capacitor (e.g., capacitor 401) to a first voltage, where the first voltage on the first capacitor includes a second voltage (e.g., voltage 408) on a second capacitor (e.g., capacitor 402) plus an offset voltage (e.g., V1). The method continues at operation 1120 by transferring charge from the first capacitor to the second capacitor, where the first voltage on the first capacitor and the second voltage on the second capacitor are equalized. At operation 1130, it is determined if a cycle count is at a specified cycle count. If the cycle count is not at the specified cycle count, then a cycle counter is incremented in operation 1140, and operations 1110 and 1120 are repeated. If the cycle count is at the specified cycle count at operation 1130, then the value of the first capacitor is determined from the value of the second voltage at operation 1150.

Figure 7:
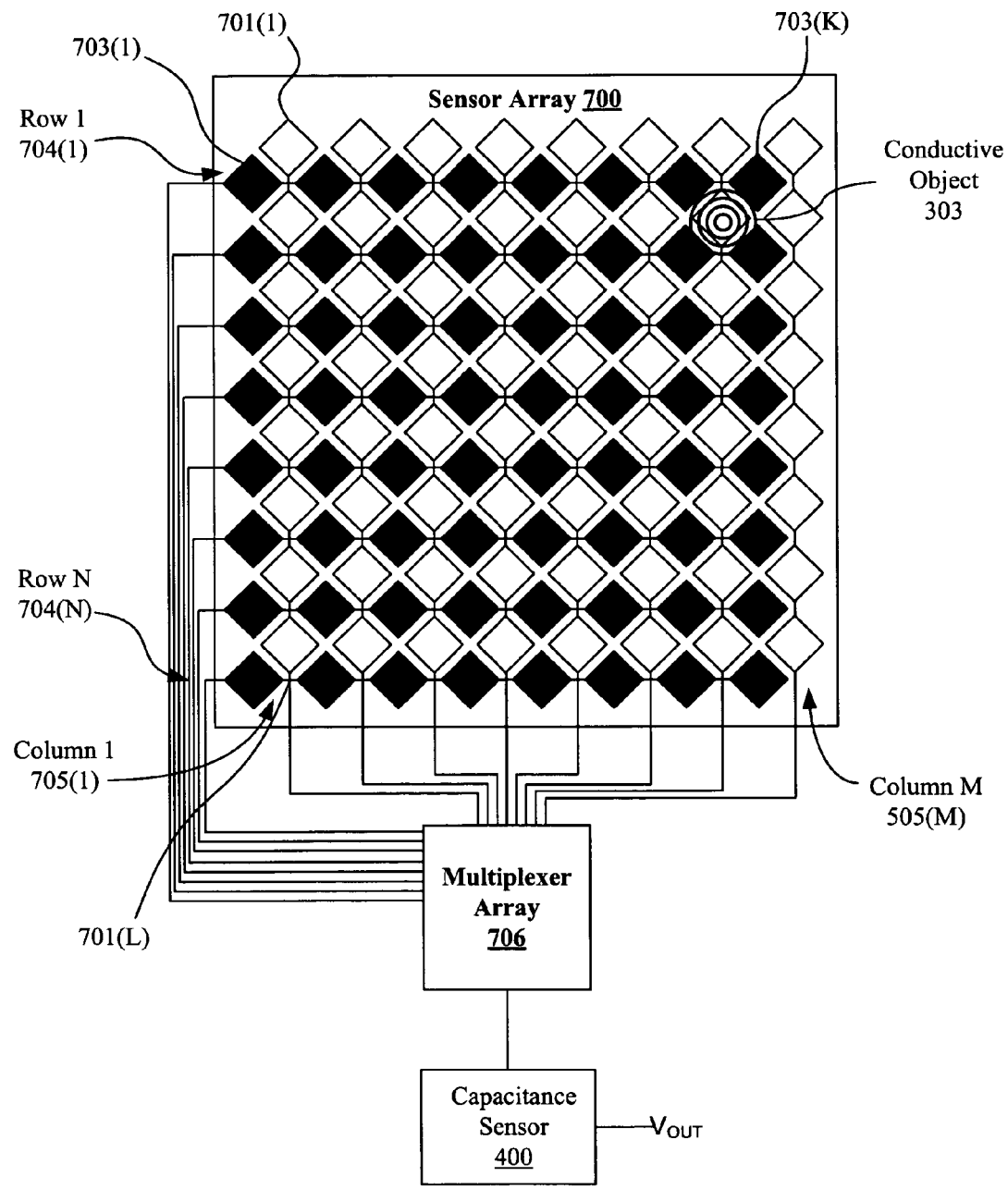
FIG. 7 illustrates a touch-sensitive component that may be combined with certain embodiments of the present invention.

As noted above, a touch sensitive capacitor may be part of a touch sensitive component such as a slider control and/or a touchpad, which may contain multiple touch sensitive capacitors. A linear charge transfer capacitance sensor, such as sensor 400 (or, equivalently, sensors 500 and/or 600), may be configured to interface with a multiple touch sensitive capacitors by multiplexing connections between the sensor and the multiple capacitor component. One example is illustrated in FIG. 7 for the case of a sensor array 700 that might be used in a touchpad. Sensor array 700 includes N rows of touch sensitive capacitors 704(1)-704(N), where each row includes K interconnected touch sensitive capacitors 701(1)-701(K), and M columns of touch sensitive capacitors 705(1)-705(M), where each column includes L interconnected touch sensitive capacitors 701(1)-701(L).

Each row and each column may be connected to a multiplexer array 706, which may be configured to selectively and/or sequentially connect each row and column, in turn, to capacitance sensor 400 (multiplexers are known in the art and, accordingly, are not described in detail). When there is no conductive object in proximity to the sensor array, sensor 400 will output a baseline signal $V_{OUT}$ versus time (e.g., in the manner of FIG. 5B) for each row and column of the array with a relationship between output voltage and time (or, equivalently, between output voltage and charge transfer cycle count corresponding to an intrinsic capacitance of the respective row or column. When a conductive object 303 contacts the sensor array, the capacitance of at least one row and one column will be increased, and the voltage versus time function associated with that row or column will be changed. The change may be detected, as described in greater detail below, to identify the row and column and locate the conductive object. It will be appreciated that the same or similar principles may be used to locate a conductive object along a one dimensional array as might be used in a slider control, for example.

Figure 4C:
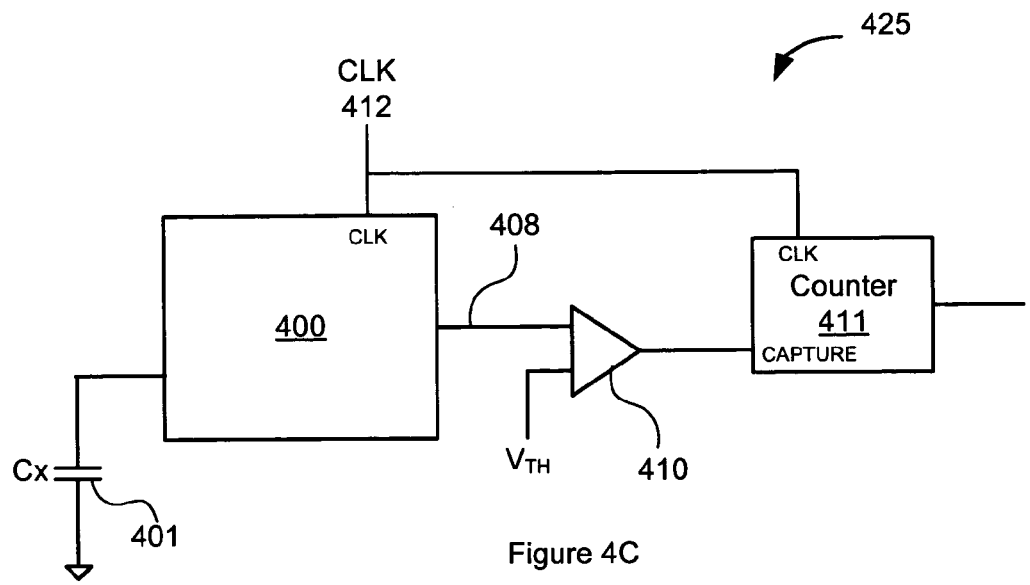
FIGS. 4C-4D illustrate embodiments of circuits implementing linear charge transfer to measure capacitance.

FIG. 4C is a block diagram illustrating a circuit 425 that may be used to implement a method such as method 1000 described above.

Circuit 425 includes linear charge transfer capacitance sensor 400 and touch-sensitive capacitor 401. In circuit 425, output 408 is coupled to one input of a comparator 410. The other input to the comparator is coupled to a threshold voltage $V_{TH}$ and he output of the comparator is coupled to a counter 411. Clock 412 is applied to sensor 400 to toggle the switches 403 and 404 in sensor 400. Clock 412 is also applied to counter 411 to increment counter 411 synchronously with charge transfer cycles in sensor 400. When output 408 reaches the threshold voltage $V_{TH}$, the output of comparator 410 changes and the state of counter 411 is captured. The output of counter 411, the value of N, may be used to measure the capacitance of capacitor 401.

Figure 4D:
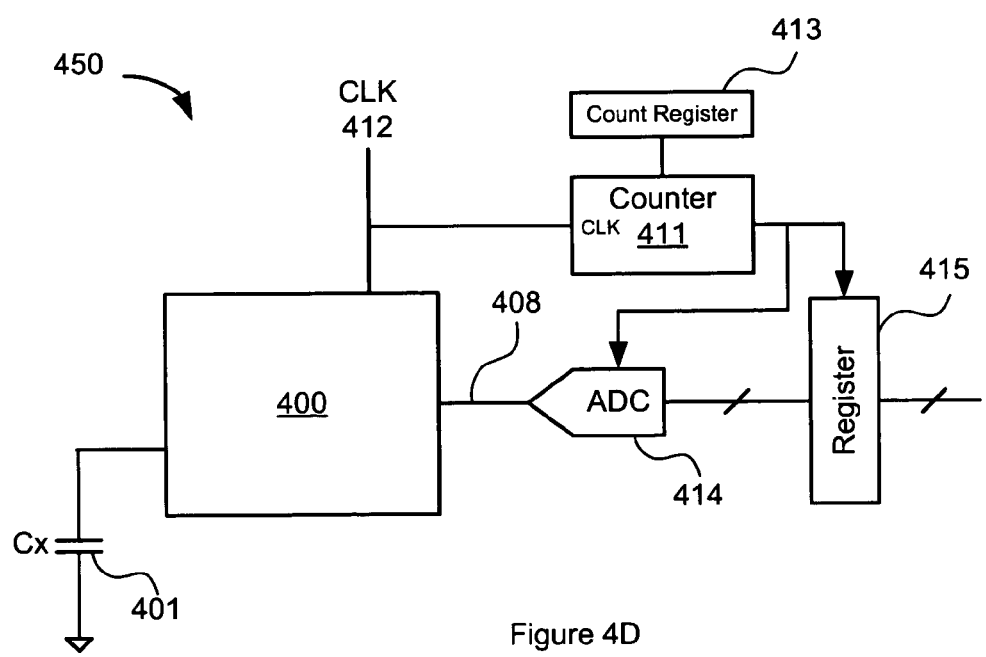

FIG. 4D is a block diagram of a circuit 450 that may be used to implement a method such as method 1100 described above.

Circuit 450 includes linear charge transfer capacitance sensor 400 and touch-sensitive capacitor 401. In circuit 450, output 408 is coupled to an analog to digital converter (ADC) 414. The output of ADC 414 is coupled to a register 415 that is controlled by a counter 411. A count value for counter 411 is loaded into counter 411 from a count register 413 which holds a predetermined cycle count number N. Clock 412 drives both sensor 400 and counter 411, so that counter 411 counts the number of charge transfer cycles within sensor 400. After the completion of N charge transfer cycles, the ADC conversion is started. When the ADC data is ready, it is transferred to the output register 415.

Figure 8:
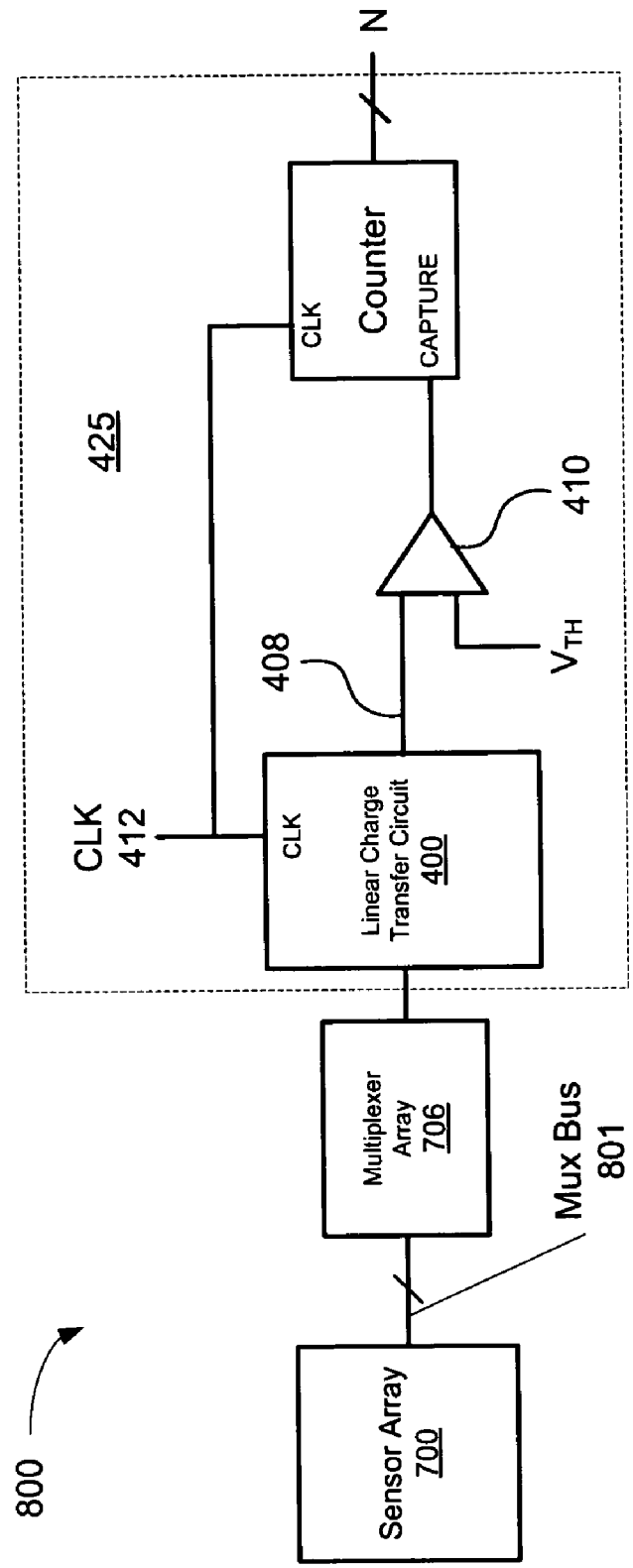
FIG. 8 is a block diagram illustrating a system for determining the capacitances of a sensor array in one embodiment.

FIG. 8 is a block diagram illustrating an exemplary system 800 in one embodiment for measuring the capacitances of a touch-sensitive sensor array. System 800 includes sensor array 700 described above, coupled via a mux bus 801 to multiplexer array 706 described above, and a linear charge transfer circuit 400 in a circuit 425, described above, to measure the charge transfer cycle count when output 408 reaches the threshold voltage $V_{TH}$.

Figure 9:
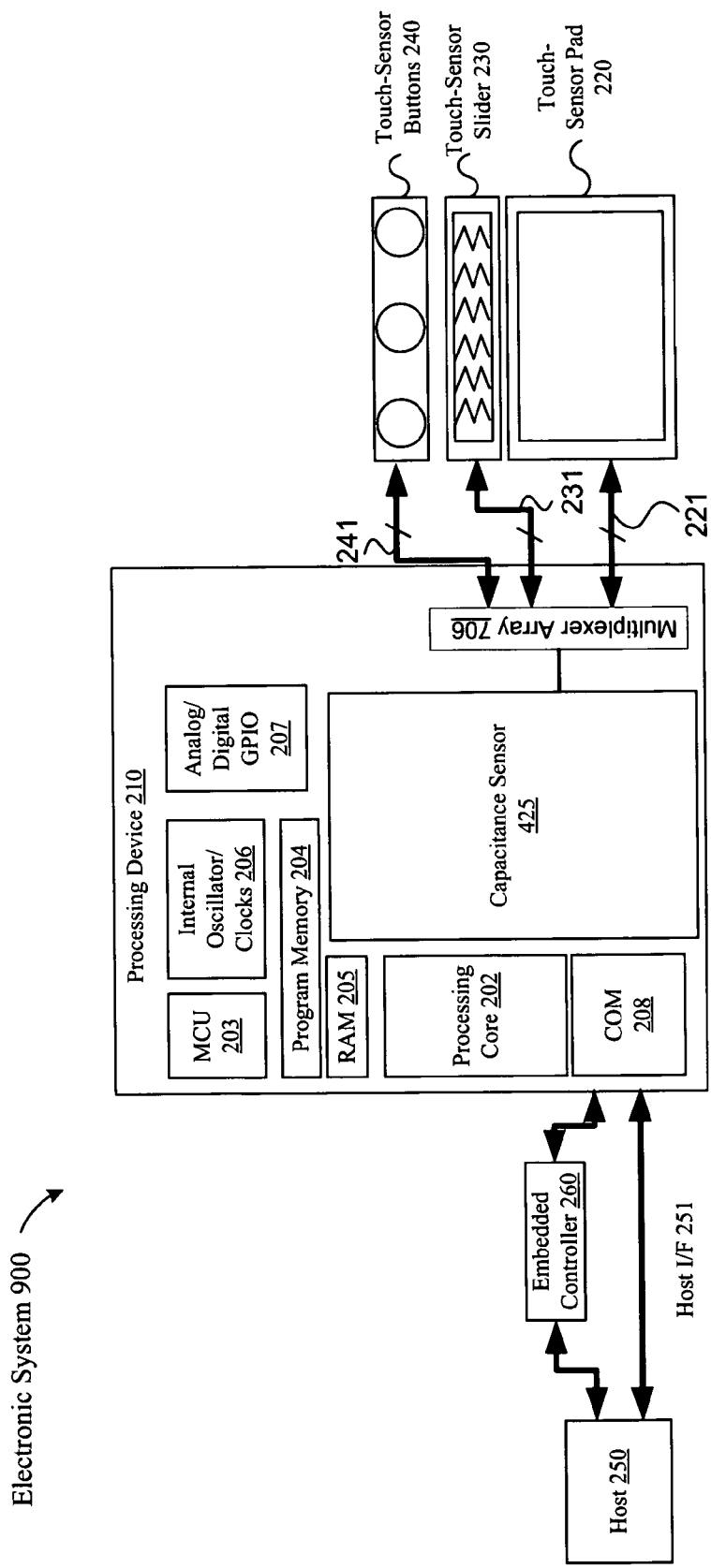
FIG. 9 is a block diagram of an electronic system in which embodiments of the present invention may be implemented.

FIG. 9 illustrates a block diagram of one embodiment of an electronic system 900 in which embodiments of the present invention may be implemented. Electronic system 900 includes processing device 210 and may include touch-sensor pad 220, touch-sensor slider 230, touch-sensor buttons 240, host processor 250 and embedded controller 260. The processing device 210 may include analog and/or digital general purpose input/output ("GPIO") ports 207. GPIO ports 207 may be programmable. GPIO ports 207 may be coupled to a Programmable Interconnect and Logic ("PIL"), which acts as an interconnect between GPIO ports 207 and a digital block array of the processing device 210 (not illustrated). The digital block array may be configured to implement a variety of digital logic circuits (e.g., DAC, digital filters, digital control systems, etc.) using, in one embodiment, configurable user modules ("UMs"). The digital block array may be coupled to a system bus (not illustrated). Processing device 210 may also include memory, such as random access memory (RAM) 205 and program memory 204. RAM 205 may be static RAM (SRAM), dynamic RAM (DRAM) or any other type of random access memory. Program memory 204 may be any type of non-volatile storage, such as flash memory for example, which may be used to store firmware (e.g., control algorithms executable by processing core 202 to implement operations described herein). Processing device 210 may also include a memory controller unit (MCU) 203 coupled to memory and the processing core 202.

The processing device 210 may also include an analog block array (not illustrated). The analog block array is also coupled to the system bus. The analog block array also may be configured to implement a variety of analog circuits (e.g., ADC, analog filters, etc.) using, in one embodiment, configurable UMs. The analog block array may also be coupled to the GPIO 207.

As illustrated in FIG. 9, processing device 210 may include capacitance sensor circuit 425 (alternatively, capacitance sensor circuit 450), as described above. In certain embodiments, capacitance sensor 425 may include analog I/O for coupling to an external component, such as touch-sensor pad 220, touch-sensor slider 230, touch-sensor buttons 240, and/or other devices. Capacitance sensor circuit 425 and processing device 210 are described in more detail below.

It should be noted that the embodiments described herein are not limited to touch-sensor pads for notebook implementations, but can be used in other capacitive sensing implementations. For example, the sensing device may be a touch-sensor slider 230 or a touch-sensor button 240 (e.g., capacitance sensing button). Similarly, the operations described herein are not limited to notebook cursor operations, but can include other operations, such as lighting control (dimmer), volume control, graphic equalizer control, speed control or other control operations requiring gradual adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc) handwriting recognition and numeric keypad operation.

In one embodiment, as noted above, the electronic system 900 includes a touch-sensor pad 220 coupled to the processing device 210 via bus 221. Touch-sensor pad 220 may include a multi-dimension sensor array. The multi-dimension sensor array comprises a plurality of sensor elements, organized as rows and columns. In another embodiment, the electronic system 900 includes a touch-sensor slider 230 coupled to the processing device 210 via bus 231. Touch-sensor slider 230 may include a single-dimension sensor array. The single-dimension sensor array comprises a plurality of sensor elements, organized as rows, or alternatively, as columns. In another embodiment, the electronic system 900 includes a touch-sensor button 240 coupled to the processing device 210 via bus 241. Touch-sensor button 240 may include a single-dimension or multi-dimension sensor array. The single- or multi-dimension sensor array comprises a plurality of sensor elements. For a touch-sensor button, the plurality of sensor elements may be coupled together to detect a presence of a conductive object over the entire surface of the sensing device. Alternatively, the touch-sensor button 240 has a single sensor element to detect the presence of the conductive object. In one embodiment, the touch-sensor button 240 may be a capacitive sensor element. Capacitive sensor elements may be used as non-contact switches. These switches, when protected by an insulating layer, offer resistance to severe environments.

The electronic system 900 may include any combination of one or more of the touch-sensor pad 220, touch-sensor slider 230 and/or touch-sensor button 240. In another embodiment, the electronic system 900 may also include non-capacitive sensor elements 270 coupled to the processing device 210 via bus 271. The non-capacitive sensor elements 270 may include buttons, light emitting diodes (LEDs) and other user interface devices, such as a mouse, a keyboard or other functional keys that do not require capacitance sensing. In one embodiment, buses 271, 241, 231 and 221 may be a single bus. Alternatively, these buses may be configured into any combination of one or more separate buses.

The processing device may also provide additional functionality such as keyboard control integration, LEDs, battery charger and general purpose I/O, as illustrated as non-capacitive sensor elements 270. Non-capacitive sensor elements 270 are coupled to the GPIO 207.

Processing device 210 may include internal oscillator/clocks 206 and communication block 208. The oscillator/clocks block 206 provides clock signals to one or more of the components of processing device 210. Communication block 208 may be used to communicate with an external component, such as a host processor 250, via host interface (I/F) line 251. Alternatively, processing block 210 may also be coupled to embedded controller 260 to communicate with the external components, such as host 250. Interfacing to the host 250 can be through various methods. In one exemplary embodiment, interfacing with the host 250 may be done using a standard PS/2 interface to connect to an embedded controller 260, which in turn sends data to the host 250 via low pin count (LPC) interface. In some instances, it may be beneficial for the processing device 210 to do both touch-sensor pad and keyboard control operations, thereby freeing up the embedded controller 260 for other housekeeping functions. In another exemplary embodiment, interfacing may be done using a universal serial bus (USB) interface directly coupled to the host 250 via host interface line 251. Alternatively, the processing device 210 may communicate to external components, such as the host 250 using industry standard interfaces, such as USB, PS/2, inter-integrated circuit (12C) bus, or system packet interfaces (SPI). The host 250 and/or embedded controller 260 may be coupled to the processing device 210 with a ribbon or flex cable from an assembly, which houses the sensing device and processing device.

In one embodiment, the processing device 210 is configured to communicate with the embedded controller 260 or the host 250 to send and/or receive data. The data may be a command or alternatively a signal. In an exemplary embodiment, the electronic system 900 may operate in both standard-mouse compatible and enhanced modes. The standard-mouse compatible mode utilizes the HID class drivers already built into the Operating System (OS) software of host 250. These drivers enable the processing device 210 and sensing device to operate as a standard cursor control user interface device, such as a two-button PS/2 mouse. The enhanced mode may enable additional features such as scrolling (reporting absolute position) or disabling the sensing device, such as when a mouse is plugged into the notebook. Alternatively, the processing device 210 may be configured to communicate with the embedded controller 260 or the host 250, using non-OS drivers, such as dedicated touch-sensor pad drivers, or other drivers known by those of ordinary skill in the art.

In other words, the processing device 210 may operate to communicate data (e.g., commands or signals) using hardware, software, and/or firmware, and the data may be communicated directly to the processing device of the host 250, such as a host processor, or alternatively, may be communicated to the host 250 via drivers of the host 250, such as OS drivers, or other non-OS drivers. It should also be noted that the host 250 may directly communicate with the processing device 210 via host interface 251.

In one embodiment, the data sent to the host 250 from the processing device 210 includes click, double-click, movement of the cursor, scroll-up, scroll-down, scroll-left, scroll-right, step Back, and step Forward. Alternatively, other user interface device commands may be communicated to the host 250 from the processing device 210. These commands may be based on gestures occurring on the sensing device that are recognized by the processing device, such as tap, push, hop, and zigzag gestures. Alternatively, other commands may be recognized. Similarly, signals may be sent that indicate the recognition of these operations.

In particular, a tap gesture, for example, may be when the finger (e.g., conductive object) is on the sensing device for less than a threshold time. If the time the finger is placed on the touchpad is greater than the threshold time it may be considered to be a movement of the cursor, in the x- or y-axes. Scroll-up, scroll-down, scroll-left, and scroll-right, step back, and step-forward may be detected when the absolute position of the conductive object is within a pre-defined area, and movement of the conductive object is detected.

Processing device 210 may reside on a common carrier substrate such as, for example, an integrated circuit (IC) die substrate, a multi-chip module substrate or the like. Alternatively, the components of processing device 210 may be one or more separate integrated circuits and/or discrete components. In one exemplary embodiment, processing device 210 may be a Programmable System on a Chip (PSoC™) processing device, manufactured by Cypress Semiconductor Corporation, San Jose, Calif. Alternatively, processing device 210 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like. In an alternative embodiment, for example, the processing device may be a network processor having multiple processors including a core unit and multiple microengines. Additionally, the processing device may include any combination of general-purpose processing device(s) and special-purpose processing device(s).

Capacitance sensor circuit 425 may be integrated into the IC of the processing device 210, or alternatively, in a separate IC. Alternatively, descriptions of capacitance sensor circuit 425 may be generated and compiled for incorporation into other integrated circuits. For example, behavioral level code describing capacitance sensor circuit 425, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist or even a circuit layout and stored to a machine-accessible medium. The behavioral level code, the RTL code, the netlist and the circuit layout all represent various levels of abstraction to describe capacitance sensor circuit 425.

It should be noted that the components of electronic system 900 may include all the components described above. Alternatively, electronic system 900 may include only some of the components described above.

In one embodiment, electronic system 900 may be used in a notebook computer. Alternatively, the electronic device may be used in other applications, such as a mobile handset, a personal data assistant (PDA), a keyboard, a television, a remote control, a monitor, a handheld multi-media device, a handheld video player, a handheld gaming device, or a control panel.

Embodiments of the present invention, described herein, include various operations. These operations may be performed by hardware components, software, firmware or a combination thereof. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; electrical, optical, acoustical, or other form of propagated signal (e.g., carrier waves, infrared signals, digital signals, etc.); or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An apparatus, comprising:
    a first capacitor; and
    a capacitance sensing circuit comprising a second capacitor selectively connectable to the first capacitor, wherein the capacitance sensing circuit is configured to transfer charge linearly from the first capacitor to the second capacitor for a plurality of cycles and to determine a value of the first capacitor;
    a buffer amplifier comprising an input terminal and an output terminal, wherein the input terminal is coupled to the second capacitor; and
    an adder to add an offset voltage to an output of the buffer amplifier, the adder comprising a first terminal and a second terminal, wherein the first terminal is coupled to the output terminal of the buffer amplifier and wherein the second terminal is selectively connectable to the first capacitor.

2. The apparatus of claim 1, wherein a first voltage on the first capacitor comprises a second voltage on the second capacitor plus the offset voltage when the second terminal of the adder is coupled to the first capacitor, and wherein charge is transferred linearly from the first capacitor to the second capacitor when the second capacitor is coupled to the first capacitor.

3. The apparatus of claim 1, further comprising:
  a comparator to compare a second voltage on the second capacitor with a threshold voltage and to determine when the second voltage crosses the threshold voltage; and
  a counter to provide a count of cycles of charge transfer required for the second voltage to cross the threshold voltage, wherein the value of the first capacitor is inversely proportional to the count.

4. The apparatus of claim 1, further comprising:
  a counter to count a predetermined number of cycles of charge transfer; and
  means for measuring a second voltage on the second capacitor after the predetermined number of cycles, wherein the value of the first capacitor is directly proportional to the second voltage.

5. The apparatus of claim 1, wherein the adder comprises a summing amplifier and an offset voltage source, wherein the offset voltage and a second voltage on the second capacitor are added to provide a first voltage on the first capacitor.

6. The apparatus of claim 5, wherein the first voltage and the second voltage are referenced to ground.

7. An apparatus, comprising:
  a first capacitor; and
  a capacitance sensing circuit comprising a second capacitor selectively connectable to the first capacitor, wherein the capacitance sensing circuit is configured to transfer charge linearly to the first capacitor from the second capacitor for a plurality of cycles;
  a reference voltage selectively connectable to the second capacitor;
  a buffer amplifier comprising an input terminal and an output terminal, wherein the input terminal is coupled to the second capacitor; and
  a voltage source comprising a first terminal and a second terminal, wherein the first terminal is coupled to the output terminal of the buffer amplifier and wherein the second terminal is selectively connectable to the first capacitor.

8. The apparatus of claim 7, wherein the voltage source is configured to provide an offset voltage, wherein a first voltage on the first capacitor comprises a second voltage on the second capacitor minus the offset voltage when the second terminal of the voltage source is coupled to the first capacitor, and wherein charge is transferred linearly from the second capacitor to the first capacitor when the second capacitor is coupled to the first capacitor.

9. The apparatus of claim 7, further comprising:
  a comparator to compare the second voltage on the second capacitor with a threshold voltage and to determine when the second voltage crosses the threshold voltage; and
  a counter to provide a count of cycles of charge transfer required for the second voltage to cross the threshold voltage, wherein the value of the first capacitor is inversely proportional to the count.

10. The apparatus of claim 7, further comprising:
  a counter to count a predetermined number of cycles of charge transfer; and
  means for measuring the second voltage on the second capacitor after the predetermined number of cycles, wherein the value of the first capacitor is directly proportional to the second voltage.

11. The apparatus of claim 7, wherein the voltage source comprises a summing amplifier and an offset voltage source, wherein the offset voltage is subtracted from the second voltage on the second capacitor to provide the first voltage on the first capacitor.

* * * * *